(12) United States Patent
Aoki et al.

(10) Patent No.: US 6,714,274 B2
(45) Date of Patent: Mar. 30, 2004

(54) LIQUID CRYSTAL DISPLAY APPARATUS AND TFT PANEL

(75) Inventors: Masaru Aoki, Tokyo (JP); Masanao Kobayashi, Nagano (JP)

(73) Assignees: Mitsubishi Denki Kabushiki Kaisha, Tokyo (JP); Seiko Epson Corporation, Tokyo (JP)

( * ) Notice: Subject to any disclaimer, the term of this patent is extended or adjusted under 35 U.S.C. 154(b) by 247 days.

(21) Appl. No.: 09/729,086

(22) Filed: Dec. 5, 2000

(65) Prior Publication Data

US 2001/0003477 A1 Jun. 14, 2001

(30) Foreign Application Priority Data

Dec. 8, 1999 (JP) ............................................. 11-349010

(51) Int. Cl.⁷ ............................................ G02F 1/1343
(52) U.S. Cl. ............................. 349/139; 349/46; 257/59
(58) Field of Search ...................... 349/139, 46; 345/89; 257/59, 72

(56) References Cited

U.S. PATENT DOCUMENTS

| | | | | |
|---|---|---|---|---|
| 5,821,138 A | * | 10/1998 | Yamazaki et al. | .......... 438/166 |
| 5,844,538 A | * | 12/1998 | Shiraki et al. | ................. 345/98 |
| 5,978,058 A | * | 11/1999 | Sung | ........................... 349/139 |
| 6,104,040 A | * | 8/2000 | Kawachi et al. | .............. 257/59 |
| 6,115,089 A | | 9/2000 | Hayashi | |

FOREIGN PATENT DOCUMENTS

| | | |
|---|---|---|
| JP | 11-87670 | 3/1999 |
| JP | 11-87720 | 3/1999 |
| JP | 11-87729 | 3/1999 |
| KR | 99-0066077 | 8/1999 |

* cited by examiner

*Primary Examiner*—R. Chowdhury
*Assistant Examiner*—Prasad R. Akkapeddi
(74) *Attorney, Agent, or Firm*—Leydig, Voit & Mayer, Ltd.

(57) ABSTRACT

A liquid crystal display apparatus in which an arrangement possibly susceptible to degradation in display quality by a miss shot of a laser used for turning amorphous silicon into polycrystalline silicon is avoided and a narrow peripheral frame can be attained. A gate interconnection for transistors in a driving circuit area is arranged along a folded line having two lines extending in two different directions and a bent portion. Channel regions of the transistors are arranged along the two lines, such that the channel regions do not overlap the bent portion.

8 Claims, 22 Drawing Sheets

LIQUID CRYSTAL DISPLAY APPARATUS AND TFT PANEL

BACKGROUND OF THE INVENTION

1. Field of the Invention

The present invention relates to an active matrix type liquid crystal display apparatus having a thin film transistor (TFT) and to a TFT panel.

2. Description of the Background Art

Referring to FIG. 28, a TFT panel includes a display area 102 and a peripheral area therearound, on a transparent substrate 101. The peripheral area consists of an X-direction driving circuit portion 111, an Y-direction driving circuit portion 112, and an external connection terminal portion 117. In each driving circuit portion, driving transistors (not shown) are arranged, each of which controls and drives a pixel transistor (not shown) arranged at an intersection of a signal line and a scanning line (both not shown) in the display area. The main feature of a liquid crystal display apparatus is that it is thin and compact. It is a main attraction for a consumer purchasing the apparatus. If the driving transistors arranged in, respective driving circuit portions can be accommodated in a compact manner, a frame of the display screen can be made narrower, and hence commercial value will be increased. In this respect, the arrangement of the driving transistors in the X-direction driving circuit portion 111 in areas 115 and 116 of FIG. 28 is important.

In a TFT panel in which the display area and the driving circuit areas are integrated, polycrystalline silicon (hereinafter referred to as "polysilicon") is used at least for the driving transistors, though not necessarily for the pixel transistors. When a polysilicon film is to be formed integrally over the display area and the driving circuit area of the TFT panel, the typical method is as follows. An amorphous silicon film is formed on the substrate by reduced pressure CVD or the like, and the amorphous silicon is annealed by excimer laser beam irradiation, so that the amorphous silicon is crystallized to be a polysilicon film. It is necessary for the excimer laser beam to maintain uniform energy density, and to be incident on as wide as possible a range. Therefore, a beam having a linear cross section, with a length of 150 to 300 mm and a width of 300 $\mu$m, that is, almost a line of 0.3 mm, has been dominantly used. In case a plane is to be irradiated, the longitudinal direction of the beam is set in the Y-direction of the coordinate system shown in FIG. 28, the thin width direction of the cross section is aligned with the X-direction, and the plane is scanned by pulse-exposure with a frequency period of about 200 to 300 Hz with the beam shifted by 5 to 50 $\mu$m shot by shot along the X-direction.

The reason why polysilicon is used for the thin film semiconductor is that it is necessary to increase mobility for electrical carriers in the driving transistor. The mobility of the electrical carriers in amorphous silicon is significantly lower than the mobility in polysilicon. Therefore, amorphous silicon cannot be used for the driving transistor. Conventionally, when the display area is not integral with the driving circuit area, it was the practice that amorphous silicon was used for the pixel transistors, and single crystal silicon was used for the driving transistors which were fabricated through separate steps. The mobility in polysilicon is smaller than that in the single crystal silicon. However, necessary mobility can be ensured by making the crystals large. Accordingly, it follows that the energy density of the laser beam mentioned above must be such that it can turn the amorphous silicon into polycrystalline silicon and, in addition, attain the appropriate size of the crystal grains. The energy density of the laser beam satisfying these conditions is limited to a narrow range having upper and lower limits, though not so limited as to cause a major difficulty in implementation.

Required performance, however, may not be satisfied as to uniformity between shots of the energy density of the laser beam. More specifically, a miss shot occurs on the order of one per several tens of thousands, and the energy density falls below a lower limit or an upper limit of the above described range. At a portion affected by a miss shot, the crystal grain diameter cannot be made sufficiently large in an area corresponding to the width of one pitch of scanning, for example, an area having the width of 15 $\mu$m and a length of 150 to 300 mm. The phenomenon that the crystal grain diameter cannot be made sufficiently large occurs when the energy density of the laser beam is too low or too high. Therefore, when the laser beam is scanned along the direction of the channel length with the longitudinal direction of the laser beam cross section set parallel to the channel width direction of the TFT, the following problem arises. When there is an unsatisfactory shot in the TFT channel area, an area in which crystals are not sufficiently crystallized (hereinafter also referred to as defective area) is formed traversing the channel regions of the TFTs. As a result, a number of defective transistors are formed continuously along the area of the unsatisfactory shot, resulting in unsatisfactory display, and hence lower yield. FIG. 29 represents a two-dimensional arrangement of the conventional driving transistors which may possibly suffer from the problem. For a plurality of driving transistors 130 in the X-direction driving circuit portion, a gate interconnection 141, a source interconnection 143 and a drain interconnection 142 are formed continuously over the driving transistors. At portions where the interconnections and the driving transistors overlap, gate electrodes, source electrodes and drain electrodes are formed. In the source and drain electrodes, contact portions 137 are formed to be electrically connected to source and drain regions 133 and 132 of the semiconductor thin film, respectively. When viewed two-dimensionally, channel regions 131 almost overlap the gate electrode. In FIG. 29, the pulse laser is scanned along the direction of the channel length 135 shot by shot, with the longitudinal direction of the cross section of the laser beam arranged parallel to the direction of the channel width 134. At this time, when a miss shot happens to overlap the channel region, the miss shot corresponding to one pitch 140 of scanning completely traverses the channel regions 131. In FIG. 29, the hatched portions represent overlapping portions of channel regions 131 and the one pitch P of the miss shot of the laser beam. The charge carriers cannot pass through the channel regions of the transistors without passing through the hatched portions. The miss shot affects the transistor characteristic when one pitch 140 of the miss shot is formed completely traversing the channel regions. Even when one pitch 140 of scanning of the miss shot is formed completely traversing the source region or the drain region, the influence is not so great. In the arrangement of FIG. 29, a series of driving transistors connected to the gate interconnection are all damaged, and hence there is a significant influence clearly degrading the quality of display in the liquid crystal display apparatus. In such an arrangement of the driving transistors as shown in FIG. 29, driving transistors are accommodated in a compact manner in areas 115 and 116 as shown in FIGS. 30 and 31, and the frame of the display screen is not large. The gate interconnection 131 of the driving transistors (not shown) of the X-direction driving circuit portion does not extend beyond areas 115 and 116. Therefore, it is unnecessary to enlarge the width 118 of the left frame and the width 119 of the right frame. As the driving transistors in the X-direction driving circuit portion, pairs of n channel and p channel transistors (both not shown) are arranged. The paired transistors are not distinguished, if not particularly necessary.

In order to solve the problem of degraded display quality described above, a proposal has been made in which the direction of the channel width is made non-parallel to the longitudinal direction of the cross section of the laser beam (Japanese Patent Laying-Open No. 11-87720). Further, a proposal has been made in which the conditions of non-parallelism are limited, using the channel width W, channel length L, scan pitch P in the direction of the shorter axis of the cross section of the laser beam, and an angle θ between the scanning direction of the laser beam and the direction of the channel width (Japanese Patent Laying-Open Nos. 11-87729 and 11-87670). More specifically, referring to FIG. 32, the driving transistors are inclined by an angle θ with respect to the direction of the longitudinal axis of the cross section of the laser beam, such that the condition of W·sin θ>P is satisfied, where W represents the width 134 of the channel portion and P represents the scan pitch of the laser beam. When a miss shot occurs in the channel regions of driving transistors with a channel width W as wide as 700 μm, there would be a portion with sufficient margin at which the channel region can pass, without being intercepted by the defective portion resulting from the miss shot, if this condition is satisfied. In other words, there would be a considerable number of charge carriers which pass only through areas of satisfactory characteristic. As a result, the transistor characteristics are not degraded by the laser beam miss shot, and hence substantial degradation of the display quality can be avoided.

In a driving circuit controlling the display signal, however, a large number of driving transistors are arranged continuously. Therefore, when the driving transistors are arranged in series along a prescribed direction, crossing a side of a rectangular screen, the series of driving transistors extend considerably outside of the edge of the display screen. As can be seen in FIGS. 33 and 34, when the driving transistors (not shown) are inclined, the widths 118 and 119 of the frames are much increased. Such an inclined arrangement goes against the trend of narrowing the frame in the peripheral portion of the liquid crystal display screen, undesirably widening the driving circuit areas. If the scan pitch P could be made extremely small, the condition W·sin θ>P will be satisfied even when the angle θ is made smaller. If the scan pitch P is made too small, the polysilicon surface comes too coarse to be practically used. An arrangement in which driving transistors, placed obliquely to the longitudinal direction of the laser cross section, are arranged in series along the Y direction may be possible. This arrangement attains a narrower frame. In this arrangement, however, the distance between electrodes of transistors becomes narrow, making it difficult to form transistors aligned along one direction. Therefore, the arrangement in which the driving transistors placed obliquely are connected in series along the Y direction is not used for the actual manufacture of the driving circuit portion.

SUMMARY OF THE INVENTION

Therefore, an object of the present invention is to provide a liquid crystal display apparatus including a TFT panel having, at least in a driving circuit area, a polysilicon thin film generated from an amorphous silicon thin film by scan irradiation with excimer laser shots, wherein arrangement susceptible to degradation in display quality of the plurality of driving transistors formed on the polysilicon thin film in case of a miss shot of the excimer laser is avoided and in which narrower frame can be attained, as well as to provide a TFT panel therefor.

In the liquid crystal display apparatus of the present invention, a thin film semiconductor for the pixel transistors and a thin film semiconductor for the driving transistors may be formed integrally through the same process steps, or the thin film semiconductors may be formed through separate process steps and thereafter integrated with each other.

The liquid crystal display apparatus in accordance with the present invention includes a liquid crystal, a TFT panel driving the liquid crystal and an opposing substrate. The TFT panel has a display area in which a plurality of signal lines and a plurality of scanning lines are arranged intersecting with each other and a plurality of pixel transistors are arranged at the intersecting portions, and a driving circuit area including a plurality of driving transistors. A gate interconnection of the driving transistors formed in the driving circuit area is arranged along a folded line, or a zigzag line, having a first line extending linearly along a first direction, a second line extending linearly along a second direction different from the first direction, and a bent portion connecting the first and second lines. Further, the driving transistors are arranged along the first and second lines with the channel regions not overlapping the bent portion when viewed two-dimensionally.

In this structure, the channel regions of the driving transistors formed overlapping and below the gate interconnection are also arranged along the zigzag line. Therefore, the positions of the channel regions of the driving transistors can be shifted from the linear defective portion resulting from a laser miss shot. As a result, a problematic situation where the defective area is positioned traversing all the channel in the transistors is avoided, and the defective area, if any, overlaps an end portion of the channel region, the source region or the drain region, dependent on the positions of the driving transistors. Therefore, the undesirable influence of the defective portion can be dispersed, and substantial degradation of the display quality can be prevented. Further, as the transistors are arranged along the zigzag line having the lines extending in the first direction and the second direction, the driving circuit area does not extend much beyond the display screen, and hence a narrow frame can be realized. Further, it is also possible to arrange the central portions of the channel regions of the driving transistors along the zigzag line mentioned above and, in addition, to arrange the driving transistors inclined or rotated with respect to the direction of the longitudinal axis of the laser beam. In this case, each driving transistor is subjected to the shift in the direction of the laser beam scanning as well as inclination or rotation by a prescribed angle. This further decreases the possibility of generation of the driving transistors entirely along a line of which channel regions are completely traversed by the defective portion resulting from the laser miss shot. More specifically, when inclined or rotated, such an arrangement is attained in which the longitudinal direction of the thin cross section of the laser beam becomes parallel to the direction of the channel length, and hence portions at which the channel region can be passed through without obstructed by the defective portion increase. If the arrangement having the shift mentioned above is additionally implemented, the effect of dispersing the risk is attained and, in addition, the effect of the increase of the portions where the channel regions can be passed through without passing through the defective portion is attained. As a result, the driving transistors become almost free of any degradation in characteristics.

The channel regions are formed avoiding the bent portion of the gate interconnection when viewed two-dimensionally from the following reason. At the bent portion, there would be an electric field concentration, possibly affecting movement of the charge carriers in the channel regions, and possibly causing malfunction.

The driving circuit area may be formed integrally with the display area on one substrate through the same process steps, or the driving circuit area and the display area may be formed on separate substrates through different process steps, and thereafter integrated with each other. Therefore, the semiconductor thin film of the pixel transistor may be the amorphous silicon, or it may be the polysilicon formed integrally through the same process steps.

In the liquid crystal display apparatus of the present invention described above, the first line and the second line are arranged such that the direction from an end point closer to the display area to an end point far from the display area are reversed, when viewed from the side of the display area.

By this structure, it becomes possible to prevent the defective area from completely traversing the channel regions of all of the series of transistors, and to actually realize narrower frame. The direction or length viewed from the side of the display area is the direction of projection or the length of projection of the display area to the peripheral edge.

In the liquid crystal display apparatus of the present invention, the first and the second lines are each consist of smaller folded lines, that is, zigzag lines.

By this structure, it becomes possible to arrange the whole series of driving transistors such that the channel length direction of each driving transistor is set parallel to the direction in which a boundary between the display area and the driving circuit area extends, along the first line, for example. More specifically, it becomes possible to set the direction of interconnections including the gate interconnection parallel to the width direction of the channel region, and additionally to set the arrangement of each driving transistor freely.

In the liquid crystal display apparatus in accordance with the present invention, the bent portion includes a line connecting the first and second lines and crossing the boundary between the display area and the driving circuit area almost orthogonally.

By this structure, it becomes possible to arrange the driving transistor with sufficient margin, along the folded zigzag line.

In the liquid crystal display apparatus of the present invention, the bent portion includes a portion where the first and second lines are connected directly, with a certain angle therebetween.

This structure enables narrowing of the frame in the X-direction (the direction in which the boundary between the display area and the driving circuit area extends), as well as in the Y-direction (vertical direction of the boundary). In other words, the driving transistors are arranged with high density along the Y direction. It is preferred that the driving transistors arranged along the first and second lines are shifted in position in the X direction so as to disperse risks, that is, the transistors should not be positioned commonly aligned with respect to the defective area that is parallel to the Y direction. Further, it is preferred that the axial direction of the channel regions is much inclined from the Y direction, so as to prevent the channel directions from being completely traversed by the defective area.

In the liquid crystal display apparatus of the present invention, the width direction of the channel region of the driving transistor is arranged parallel to the first and second lines. By this structure, not only the width direction of the channel region but also the width directions of the source and drain regions are also made parallel to the direction of the source and drain interconnections, respectively, whereby formation of the interconnections is facilitated.

In the liquid crystal display apparatus of the present invention, the display area is rectangular, and the driving circuit area is arranged not to extend beyond extended lines from two parallel opposing sides of the rectangular display area.

Because of this structure, it becomes possible to realize dispersion of risks as well as narrowing of the frame, while crystallization and crystal growth are ensured without any unevenness, over the entire display screen with high efficiency, with the laser beam not unnecessarily overlap at any portion at the time of laser annealing.

In the liquid crystal display apparatus of the present invention, a distance from a driving transistor and a neighboring driving transistor positioned nearest to the first mentioned driving transistor viewed from the side of the display area is made longer than the interval of pitch stripes, which are the traces of laser beam scanning.

Because of this structure, even when a defective portion resulting from a laser beam miss shot traverses a channel region of one driving transistor, the defective portion passes through the source region or the drain region of the neighboring driving transistor. As a result, substantial influence of the defective portion on the display quality can be avoided, and the production yield can be improved.

In the liquid crystal display apparatus of the present invention, the channel region of each driving transistor is formed such that the distance between a corner of the channel region nearest to the display area and a corner of the channel region farthest from the display area when viewed from the side of the display area is made longer than the interval of pitch stripes, which are the traces of laser beam scanning.

In this structure, the driving transistors must be arranged inclined or rotated with respect to a vertical line from the aforementioned sides. When the driving transistors are arranged inclined or rotated with respect to the direction of the longer axis of the laser beam, portions where the charge carriers can pass not hindered by the defective portion increases by the reason described above, even in the worst case where the defective portion resulting from the laser beam miss shot goes through the channel portion.

In a liquid crystal display apparatus in which the distance between the corners of the channel region is longer than the interval between the pitch stripes, a portion where the charge carriers can pass through the channel region without hindered by the defective portion surely exists, even when the defective portion goes through the channel region. Therefore, the undesired influence of the defective portion on the display quality can be avoided.

In the liquid crystal display apparatus described above, the driving transistors and the pixel transistors may be formed on a polysilicon film formed integrally on one substrate. Alternatively, the driving transistors and the pixel transistors may be formed on thin film semiconductors formed through separate process steps on separate substrates and thereafter be integrated. In either type liquid crystal display apparatus, as long as the transistors in the driving circuit area are formed with the amorphous silicon turned to polysilicon, the features described above exhibit the function of preventing substantial degradation of display quality. In both types of liquid crystal display apparatuses, the semiconductor in the display area may be an amorphous silicon film as it is, or it may be a polysilicon film prepared by irradiating the amorphous silicon with the excimer laser beam integrally in the same process step.

The TFT panel of the present invention is for driving liquid crystal, having a display area including a plurality of signal lines and a plurality of scanning lines arranged intersecting with each other and a plurality of pixel transistors arranged at the intersecting portions, and a driving circuit area including a plurality of driving transistors. A gate interconnection of the driving transistors formed in the driving circuit area is arranged along a folded line, or a zigzag line, including a first line extending linearly along a first direction, a second line extending linearly along a second direction different from the first direction, and a bent portion connecting the first and second lines. Further, the driving transistors are arranged along the first and second lines with the channel regions not overlapping the bent portion, when viewed two-dimensionally.

The TFT panel having such as a structure is used in a liquid crystal display apparatus, whereby the defective portion is dispersed at the central portion and an end portion of the channel region as well as the source and drain regions. Therefore, significant degradation of display quality can be avoided. Further, when the driving transistors are arranged rotated by a prescribed angle with the channel region being the center, with the driving transistors shifted from each other as described above, the risk can further be dispersed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described with reference to the figures.

First Embodiment

Figure 1:
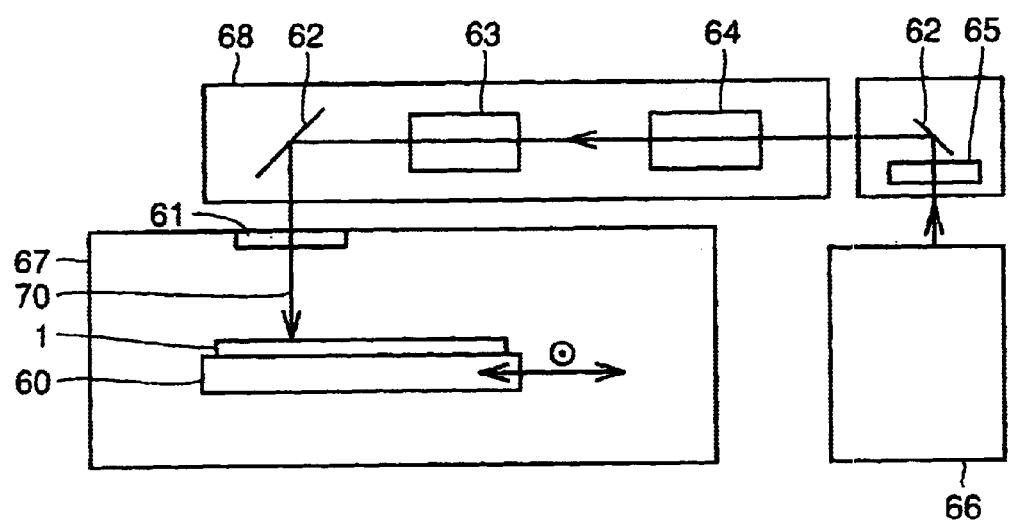
FIG. 1 is an illustration representing a laser optical apparatus used for laser annealing in a first embodiment.
Figure 2:
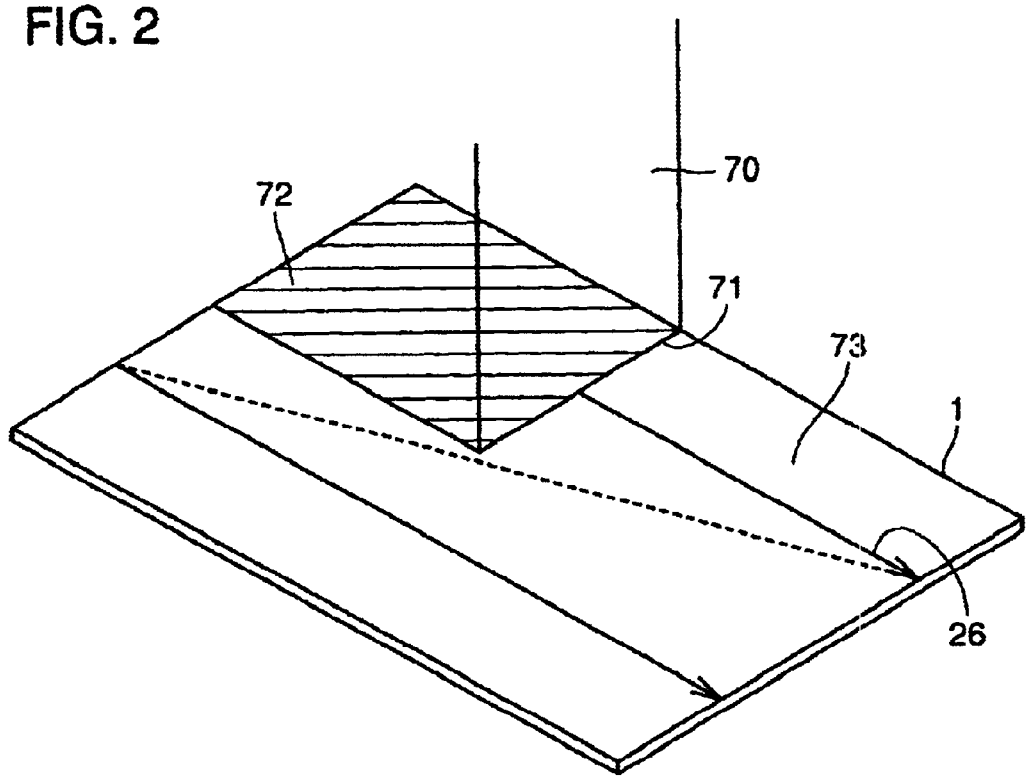
FIG. 2 is a schematic illustration representing a procedure of annealing an amorphous silicon film formed on an TFT substrate with an excimer laser beam.
Figure 3:
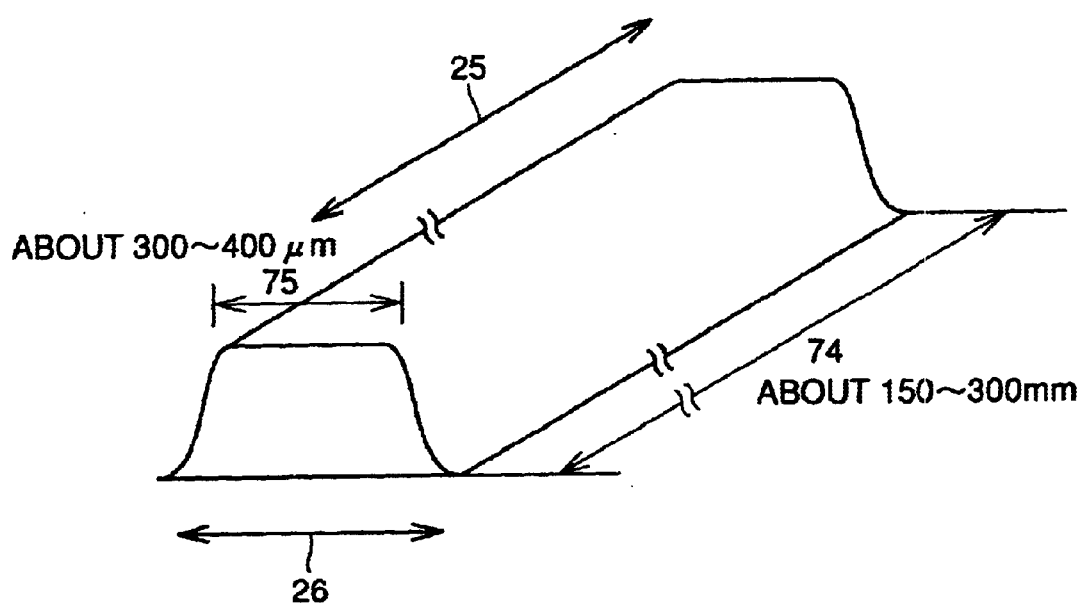
FIG. 3 shows a distribution of energy density of the laser beam.
Figure 4:
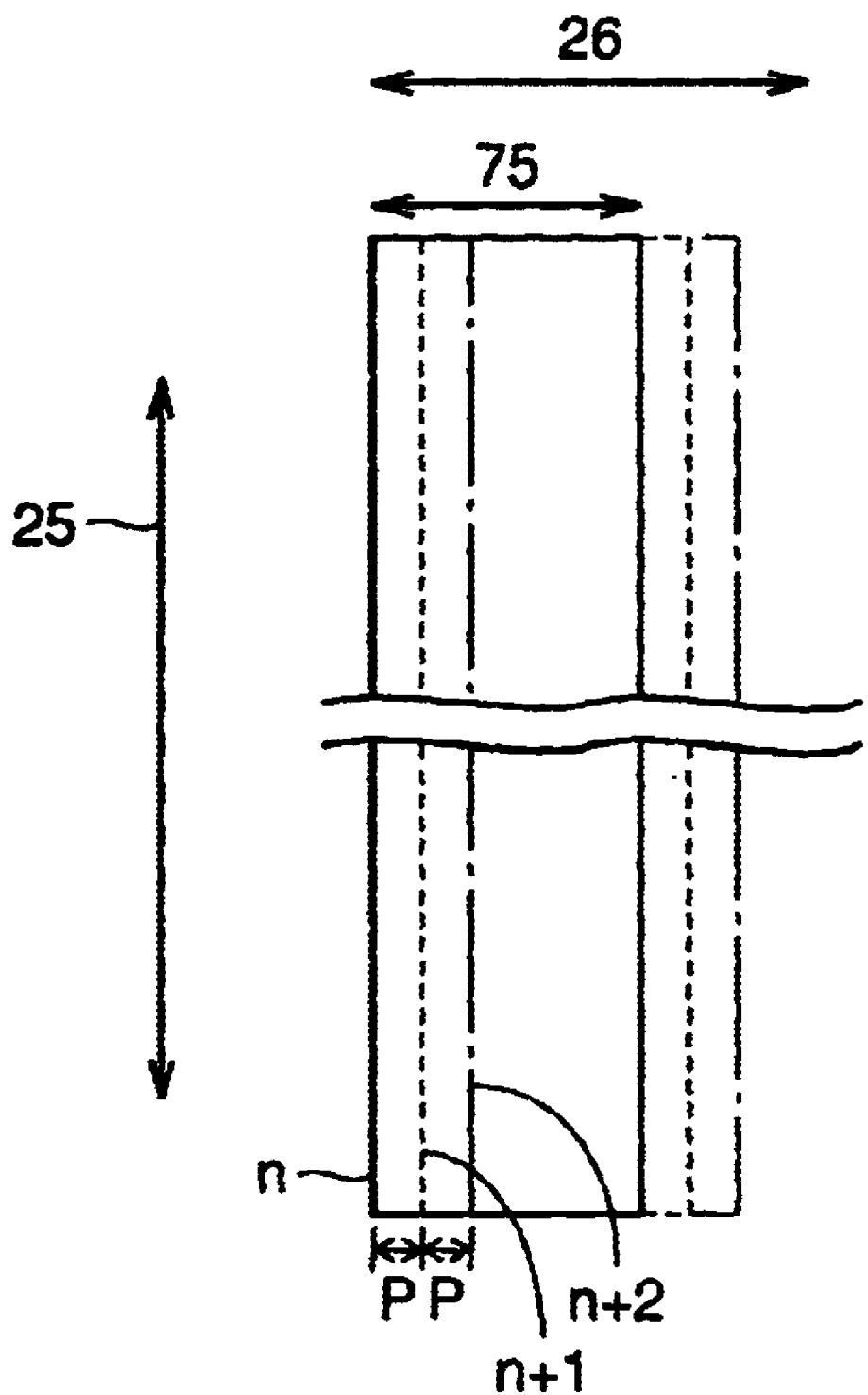
FIG. 4 represents a scanning direction of a rectangular cross section of the pulse laser beam in the laser annealing.

Referring to FIG. 1, an excimer laser using XeCl as an oscillation gas generating the wavelength of 308 nm was used for the laser oscillator 66. The pulse shot pitch was set in the range of 100 Hz to 300 Hz. As the oscillation gas, KrF may also be used. At this time, a miss shot occurs at the rate of several shots per one million shots. A laser beam 70 emitted from laser oscillator 66 passes through an attenuator 65, has its direction turned by a mirror 62, and has its beam cross section adjusted to a thin long rectangle, by beam shaping optical systems 63 and 64. Thereafter, the beam is again has its direction changed by mirror 62, exits an optical system housing 68, and enters a chamber 67 through a window 61. A substrate 1 placed on an X-Y stage 60 in chamber 67 is movable both in X and Y directions, by the movement of the X-Y stage. The laser beam is directed to an amorphous silicon film formed on substrate 1. Referring to FIG. 2, the laser beam 70 having a longitudinal rectangular cross section anneals the irradiated area 71, shifted shot by shot with a pitch of a prescribed interval, along the direction of shorter axis 26 of the rectangle. The amorphous silicon film formed on substrate 1 is crystallized to be polysilicon at the area 72 which has already been irradiated. The area 73 which is not yet irradiated is still amorphous. Referring to FIG. 3, the laser beam has a longitudinal rectangular cross section, of which length 74 along the longer axis direction 25 is 150 to 300 mm, while the length 76 along the shorter axis direction 26 is within the range of 300 to 400 $\mu$m (0.3 to 0.4 mm). The energy density varies by about ±2% over the rectangular cross section. The density varies by about ±15% pulse shot by pulse shot. When a plane is to be annealed with the laser beam having the rectangular cross section, scanning is performed with the pitch P of a prescribed interval, along the shorter axis direction 26 of the laser beam cross section, as shown in FIG. 4. In FIG. 4, the area irradiated by the nth shot is represented by the solid line, the area irradiated by the n+1th shot is represented by a dotted line, and the area irradiated by the n+2th shot is represented by a chain dotted line.

Figure 5:
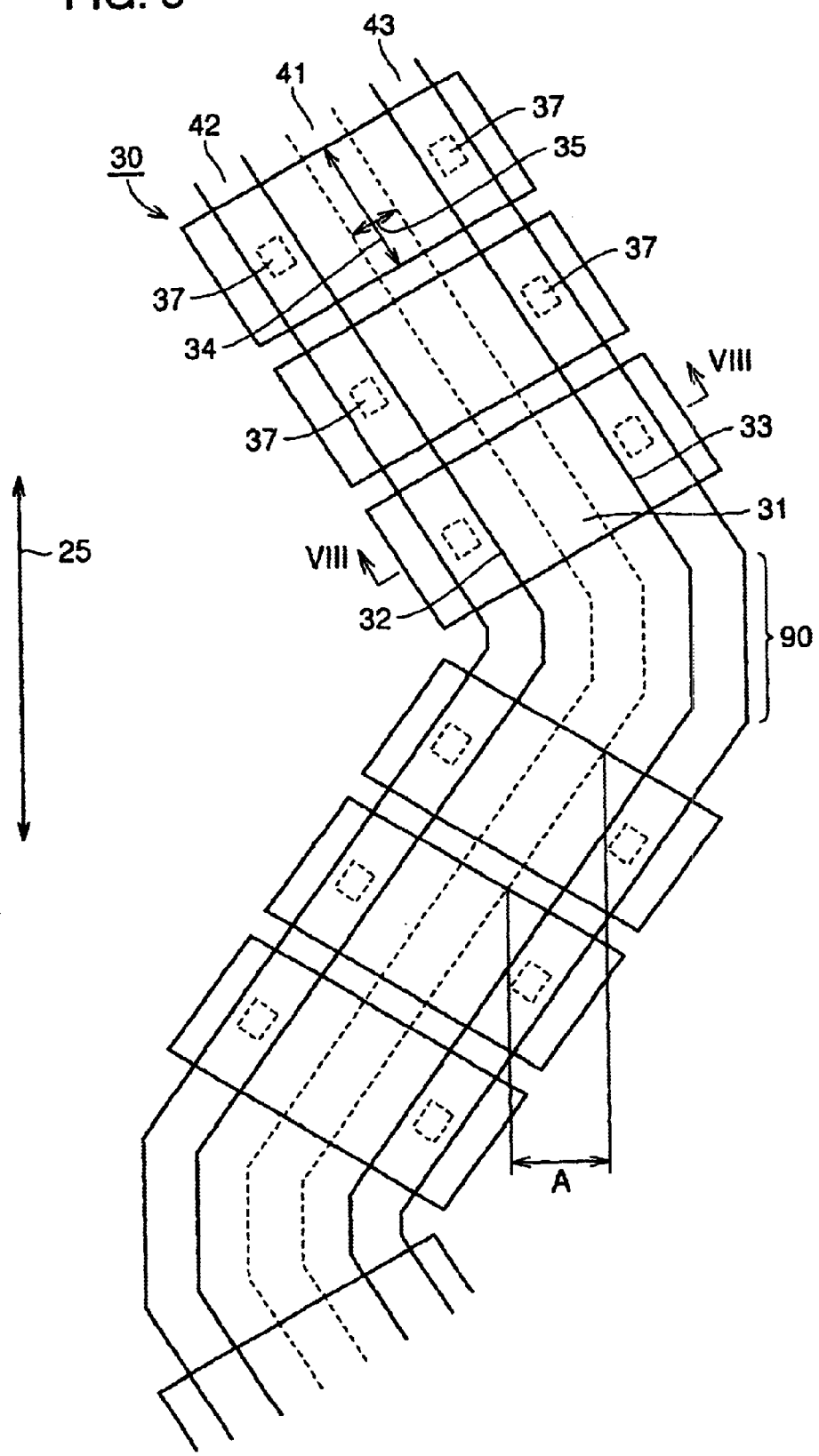
FIG. 5 is a plan view representing arrangement of driving transistors in accordance with the first embodiment.
Figure 21:
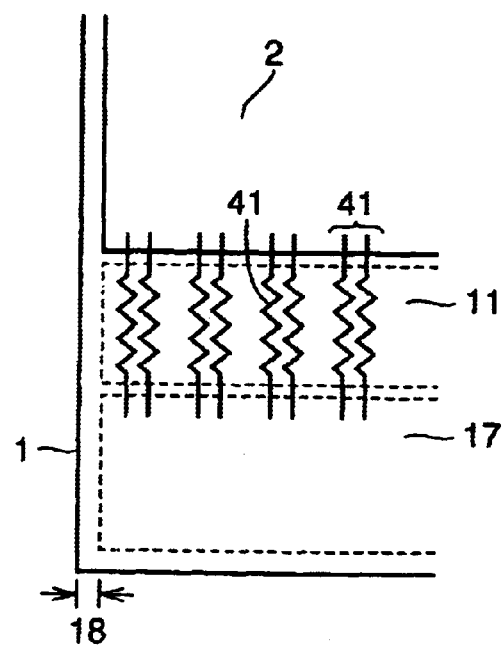
FIG. 21 is a plan view representing an arrangement of the driving transistors at a corner portion of the driving circuit portion in accordance with the first embodiment.
Figure 22:
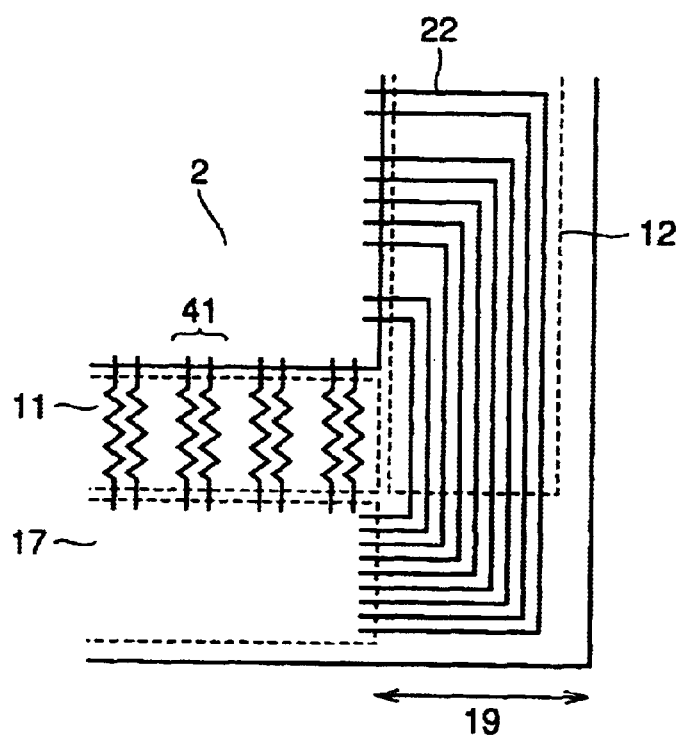
FIG. 22 is a plan view representing an arrangement of the driving transistors at another corner of the driving circuit portion in accordance with the first embodiment.

In the present embodiment, a gate interconnection 41 and the X direction driving circuit portion is arranged as shown in FIG. 5. As shown in FIG. 5, the width 34 of the channel region of each driving transistor 30 is parallel to the gate interconnection. Each driving transistor 30 has its central portion electrically coupled by gate interconnection 41 and opposing sides electrically coupled by source interconnection 43 and drain interconnection 42. Where the driving transistor overlaps these interconnections, gate, source, and drain electrodes are located. Further, in the source electrode and the drain electrode, contact portions 37 are provided, which are electrically connected to the source region 33 and the drain region 32 of the polysilicon film, respectively. Referring to FIG. 5, the channel regions of the three transistors 30 are aligned along a first straight line parallel to the channel width 34 and forming a first acute angle with the longer axis direction 25 of the laser beam. The first straight line intersects another straight line at a bent portion 90. That straight line of the bent portion 90 is parallel to the longer axis direction 25 of the laser beam. In FIG. 5, three additional unnumbered transistors in the lower part of the figure have respective channel regions aligned along a second straight line. The second straight line is oblique to the straight line of the bent portion 90, forms a second acute angle with the longer axis direction 25 of the laser beam, and forms an obtuse angle with the first straight line. The first and second straight lines, with the straight line of the bent portion 90, form a zigzag pattern that is repeated, as indicated in FIGS. 21 and 22, described below. As shown in FIG. 5, the channel regions of the transistors do not overlap the bent portion 90 of the zigzag pattern. This arrangement prevents an electric field concentration generated by the interconnections at this bent portion 90 from affecting the interconnections of the driving transistors. When the channel portion overlaps the bent portion 90 where the electric field is concentrated, a malfunction may occur, and hence such an arrangement must be avoided. A projection distance A, projected with respect to the direction of laser beam scanning, of the shift pitch between the three driving transistors arranged on each of the first and second straight lines may be larger or smaller than the pitch P of the laser beam scanning. Typically, the channel width 34 is about 20 $\mu$m, the channel length 35 is about 5 $\mu$m, and the scan pitch P of the laser beam is about 15 $\mu$m.

Figure 6:
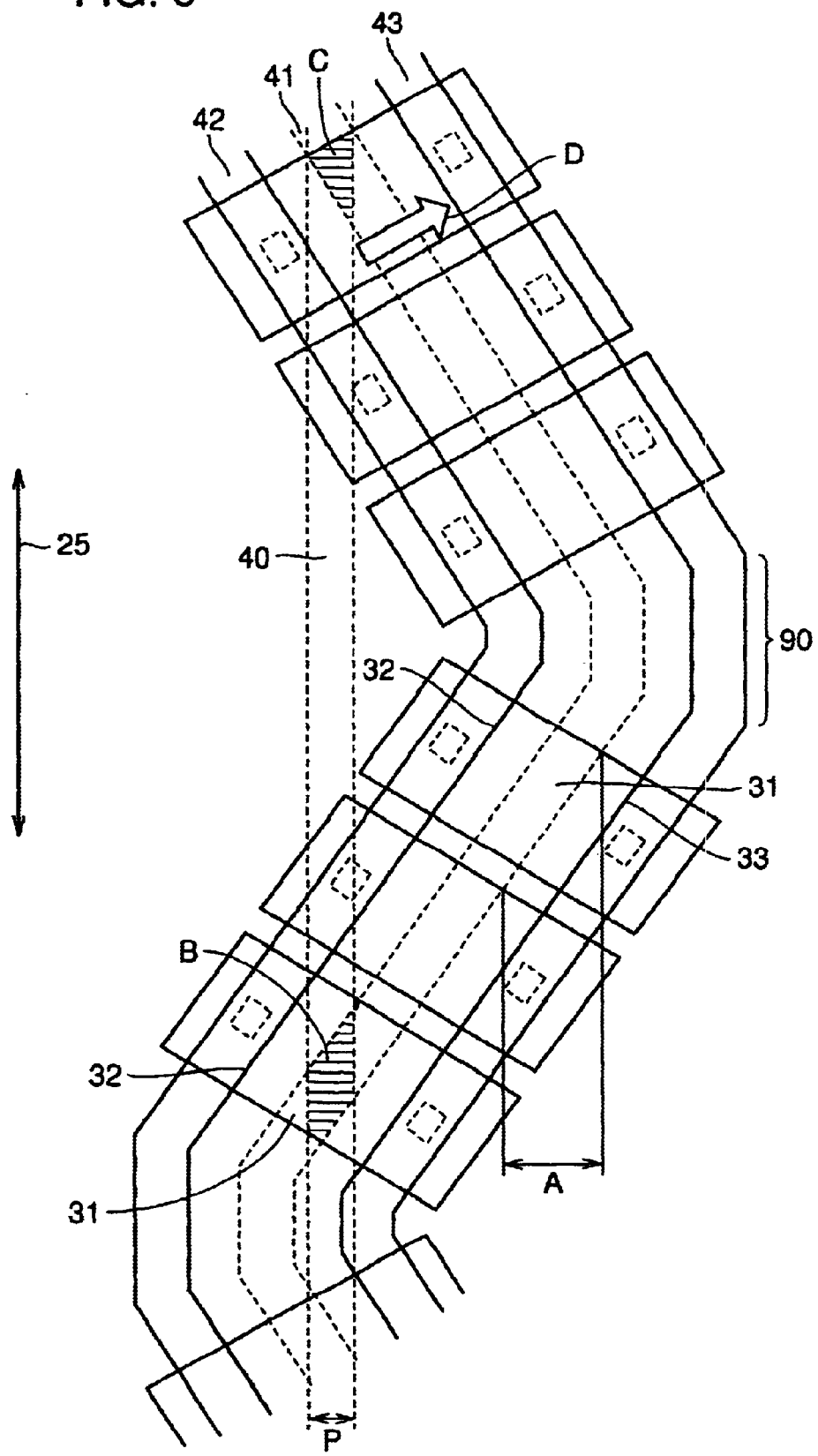
FIG. 6 is a plan view representing arrangement of the defective area with respect to the driving transistors, when the defective area resulting from a laser beam miss shot overlaps a channel region of the driving transistors shown in FIG. 5, with the shift pitch A of the driving transistors being larger than the laser beam pitch P.

FIG. 6 shows an arrangement where the defective area 40 caused by the miss shot traverses the channel region, when the pitch P of laser beam scanning is smaller than the shift pitch A of the driving transistors. The defective area 40 completely traverses the channel region of the driving transistor at an area B. It is noted, however, that by the arrangement of the driving transistors in accordance with the present invention, the defective area is prevented from fully traversing the channel regions, though the defective area may possibly overlap the source and the drain regions 32 and 33. The waves of FIG. 22 represent the zigzag folded lines. Within an arrangement of the driving transistors corresponding to ½ wavelength of the zigzag folded line, some of the driving transistors may have the channel region overlapping with the defective area, as represented by the area C. In this case, however, there is still a portion where the channel region can be passed through, not hindered by the defective area, as represented by the path of the arrow D. Therefore, the display quality is not affected. Therefore, in this case, only one sixth of the driving transistors are affected, and the display quality is not substantially degraded. Thus production yield does not decrease. Here, one sixth of the driving transistors are affected when the arrangement corresponding to one half the wavelength of the zigzag folded line shown in FIG. 6 is repeated on the portion corresponding to the remaining one half wavelength. The arrangement of the driving transistors may be shifted slightly from that shown in FIG. 6 on the portion corresponding to the remaining one half wavelength, and further, it is also possible to change the inclination or length of each line. If such an arrangement is adopted, the driving transistors which may possibly be affected can be reduced to one twelfth of all the driving transistors.

Figure 7:
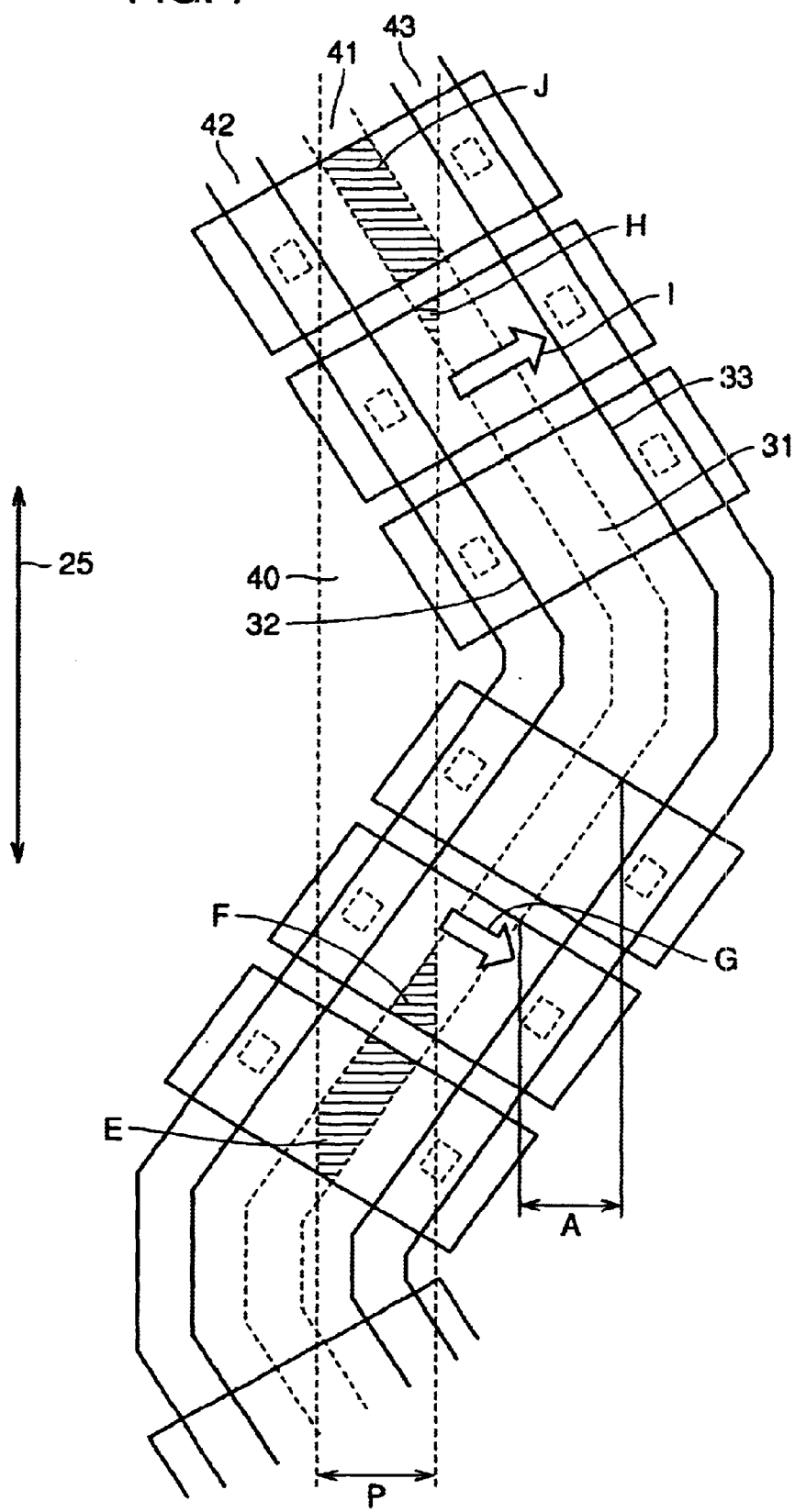
FIG. 7 corresponds to FIG. 6, with the shift pitch A of the driving transistors smaller than the laser beam pitch P.

FIG. 7 represents an arrangement where the defective area 40 caused by the miss shot traverses the channel regions, with the pitch P of the laser beam scanning being larger than the shift pitch A of the driving transistors. The defective area 40 completely traverses the channel regions of the driving transistors in two areas, that is, areas E and J. Therefore, the driving transistors on which the defective area overlaps are affected. In driving transistors having areas F and H where the defective area 40 overlaps the channel region, there are portions where the channel region can be passed, not hindered by the defective area 40, as represented by the arrows G and I. In other driving transistors, the channel regions do not overlap the defective area. Therefore, the undesirable influence appears only about one third of the driving transistors, and hence the display quality is not substantially degraded. Further, when the driving transistors arranged on the portion corresponding to the remaining one half the wavelength of the zigzag folded line are shifted from the arrangement of FIG. 7, the ratio of the driving transistors in which the channel regions are completely traversed by the effective area is further reduced.

Figure 8:
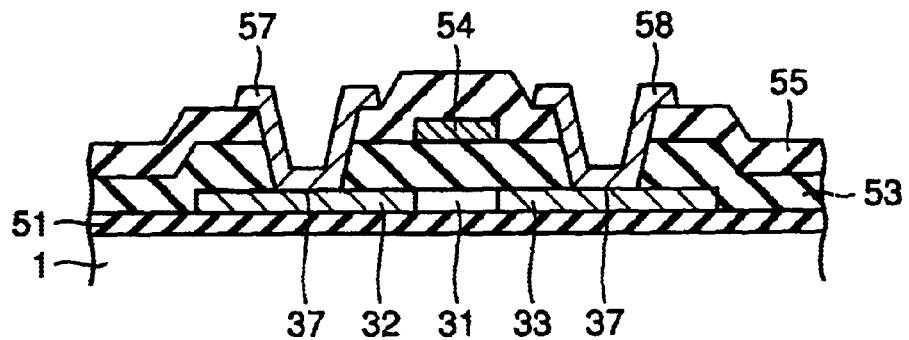
FIG. 8 is a cross section taken along the line VIII—VIII of FIG. 5.

Referring to FIG. 8, which is a cross section of the driving transistor taken along the line VIII—VIII of FIG. 5, transistor 30 is formed based on a polysilicon formed on an underlying layer 51 on a transparent substrate 1. At the central portion of the polysilicon patterned to the shape of a driving transistor, the channel region 31 is formed, and the drain and source regions 32 and 33 are formed on both sides. A gate insulating film 53 that also serves as a capacitor insulating film is stacked on these portions, and at a position therebelow overlapping the channel region 31 when viewed two-dimensionally, there is the gate electrode 54. In contact holes opened through the interlayer insulating film 55 and the gate insulating film 53 formed on these portions, a drain interconnection 57 and a source interconnection 58 are formed, providing contact portions 37 to the drain regions 2 and the source region 33, respectively.

Figure 9:
FIG. 9 is a cross section showing a step in fabricating the TFT in accordance with the first embodiment, where an under layer is formed on a glass substrate.
Figure 10:
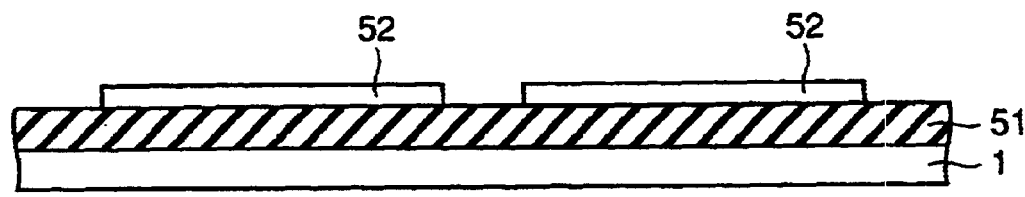
FIG. 10 is a cross section of the step following the state of FIG. 9, where an amorphous silicon film is formed, turned to polysilicon by laser annealing, and patterned into islands.
Figure 11:
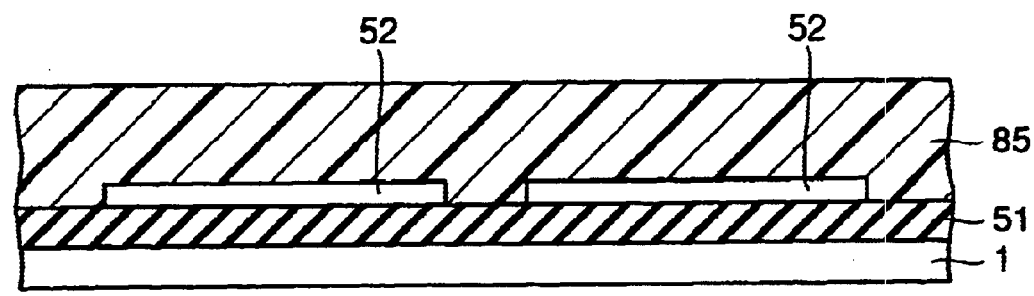
FIG. 11 is a cross section following the state of FIG. 10, where portions other than lower electrodes providing capacitance portions are covered by a resist mask, and phosphorus ions are implanted in the lower electrodes.
Figure 12:
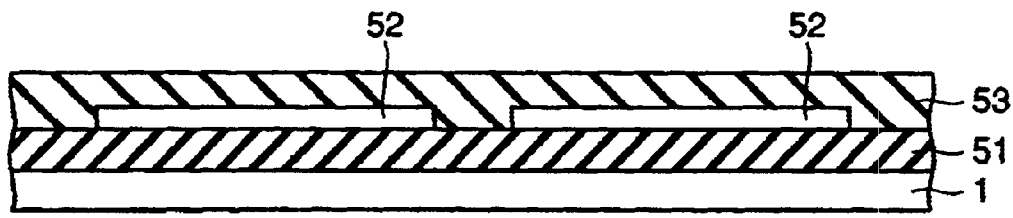
FIG. 12 is a cross section showing the step following the state of FIG. 11, in which a gate insulating film that also serves as a capacitance insulating film is formed.
Figure 13:
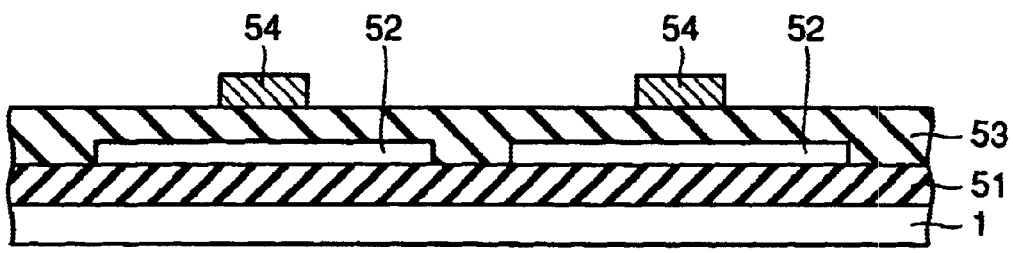
FIG. 13 is a cross section showing the step following the state of FIG. 12, where the gate electrode and a common interconnection are formed.
Figure 14:
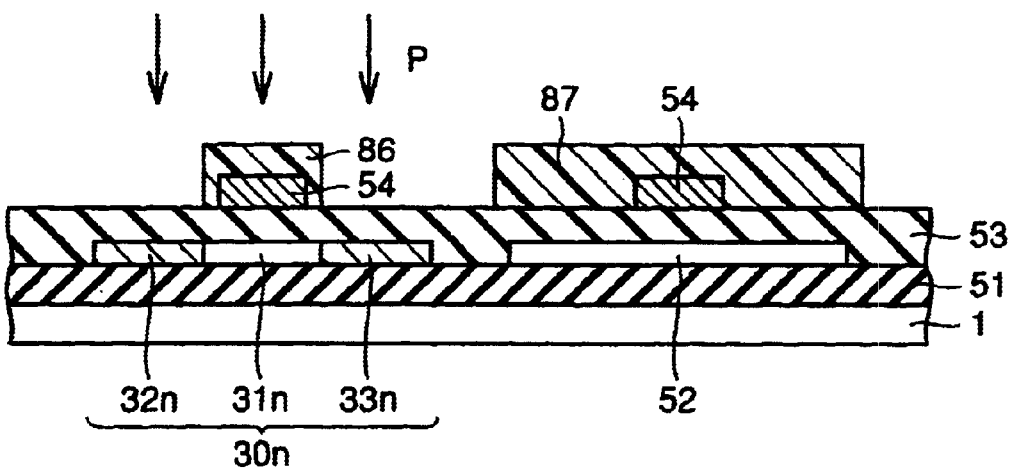
FIG. 14 is a cross section representing implantation of phosphorus ions in an n type transistor through a resist mask.
Figure 15:
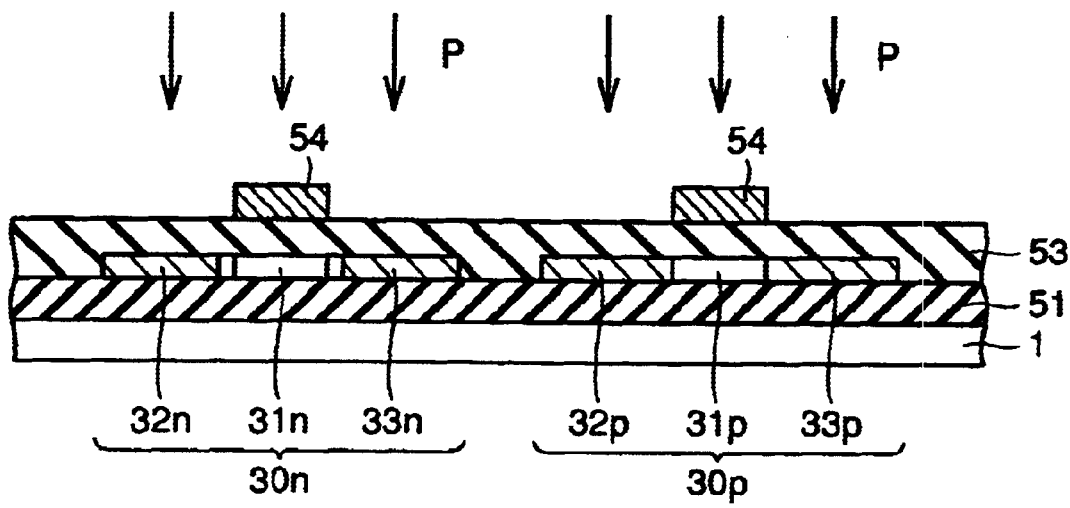
FIG. 15 is a cross section representing implantation of phosphorus ions for forming an LDD for the n type transistor, with the resist mask removed.
Figure 16:
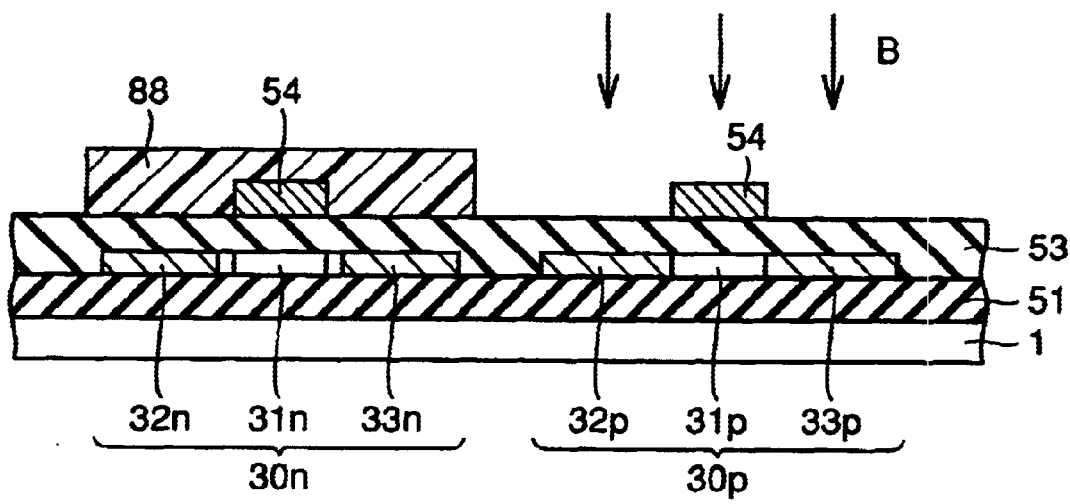
FIG. 16 is a cross section representing implantation of boron ions in source and drain regions of a p type transistor, with a resist mask provided on the n type transistor.
Figure 17:
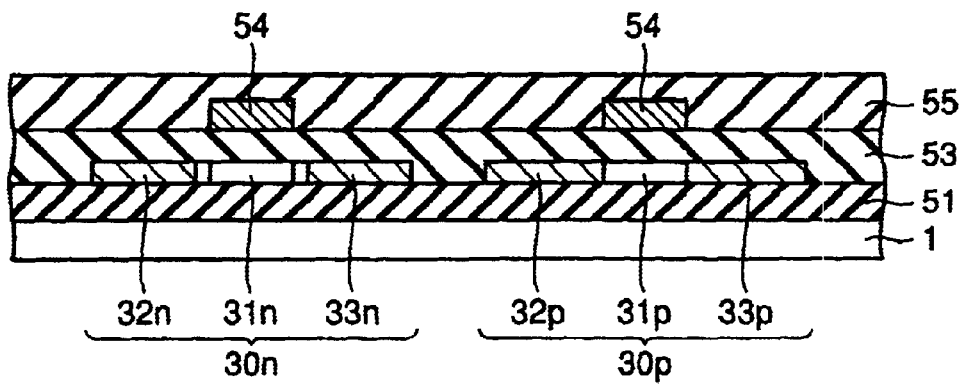
FIG. 17 is a cross section showing the step following the state of FIG. 16, where an interlayer insulating film is formed.
Figure 18:
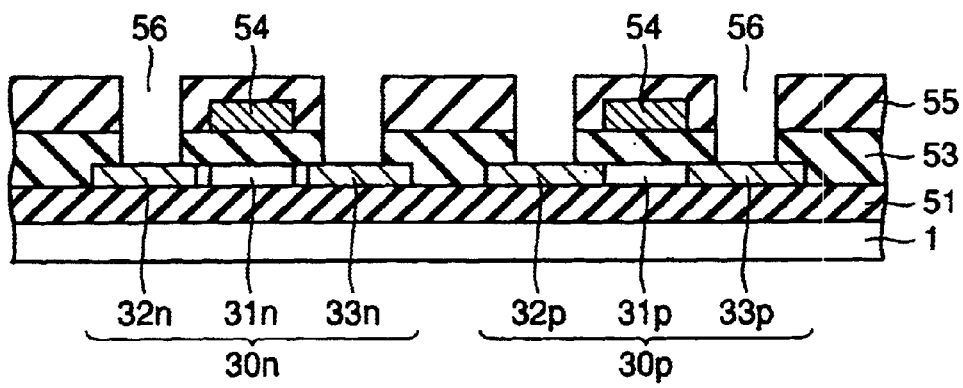
FIG. 18 is a cross section showing the step following the state of FIG. 17, where contact holes are opened above the source and drain regions.
Figure 19:
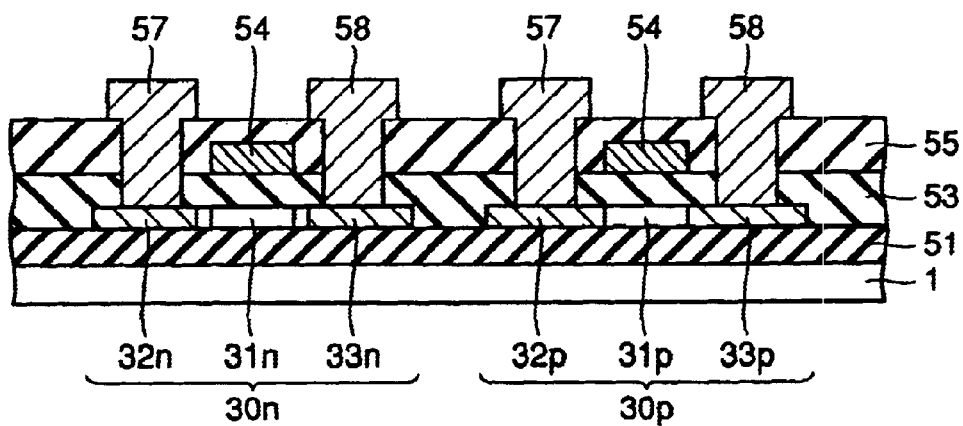
FIG. 19 is a cross section following the state of FIG. 18, in which the source and drain electrodes are formed.
Figure 20:
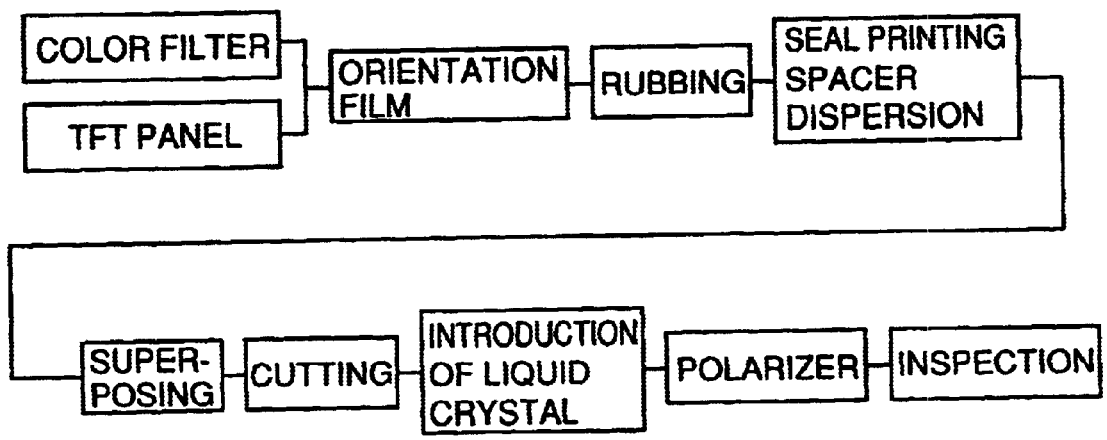
FIG. 20 represents the process steps for forming the liquid crystal display apparatus from a TFT array substrate.

The method of manufacturing the driving transistor shown in FIG. 8 will be described. First, as shown in FIG. 9, a two-layered film including a silicon nitride film and a silicon oxide film is formed as the underlying film 51 by, for example, PECVD (Plasma Enhanced Chemical Vapor Deposition) on glass substrate 1. Thereafter, an amorphous silicon film 52 is formed thereon, the amorphous silicon is turned to polysilicon by excimer laser, an area from the source to the drain is patterned, whereby the channel region 31 and the lower electrode are formed (FIG. 10). Thereafter, using a resist mask 85, portions other than the lower electrode (not shown) forming a capacitance portion are covered, and phosphorus (P) ions are implanted (FIG. 11). Thereafter, as gate insulating film 53 that also serves as the capacitor insulating film, a silicon oxide film is formed by the CVD method, as shown in FIG. 12, for example. Thereafter, a Cr film is formed and patterned to form the gate electrode 154 and a common interconnection (FIG. 13). A storage capacitance is formed between the common interconnection and the lower electrode. Thereafter, as shown in FIG. 14, a resist 86 for forming the LDD (Lightly Doped Drain) on the side of the n type transistor and a resist 87 covering the polysilicon semiconductor layer on the side of the p type transistor are provided, and P ions are implanted. As a result, the drain and source regions 32n and 33n of the n type transistor are formed. Thereafter, as shown in FIG. 15, the resist pattern is removed, and P ions are implanted to a low concentration. Thereafter, as shown in FIG. 16, the n type transistor is covered by a resist, and B ions are implanted, so as to form the source and drain regions 33p and 34p of the p type transistor. Thereafter, as shown in FIG. 17, a silicon oxide film is formed by TEOS PECVD method as an interlayer insulating film 55, and active annealing is performed at 400° C. Thereafter, as shown in FIG. 18, contact hole 56 is opened through interlayer insulating film 55 and gate oxide film 53 by dry etching. Thereafter, as shown in FIG. 19, a Cr film is formed to the thickness of 100 nm and an Al based alloy film is formed to the thickness of 400 nm, by sputtering to be stacked, and thereafter patterned to form the source and drain electrodes 57 and 58. Thereafter, a passivation film is formed, and pixel electrodes are formed in the display portion. Further, in accordance with the process shown in FIG. 20, the TFT panel fabricated through the above described steps are combined with a color filter, an orientation film is applied to the surface of the pixel electrodes and the color filter, and the direction of orientation is set by rubbing. Then, the apparatus is assembled through the common assembly process.

In the arrangement of the driving transistors in accordance with the present embodiment, the driving transistors (not shown) are arranged along the zigzag shaped gate interconnection with the central portions of the channel regions (not shown) aligned with the center of the gate interconnection, as shown in FIGS. 21 and 22. Because of this arrangement, substantial degradation of display quality when the defective portion resulting from laser beam miss shot is formed overlapping the channel regions can be avoided and, in addition, the frame is not enlarged. Namely, the widths 18 and 19 of the frame are not increased, and hence narrower frame is realized. In the present embodiment, the scan pitch P of the laser beam is 15 μm, and hence polysilicon can be prepared with high efficiency without making rough the surface of the silicon film.

Second Embodiment

Figure 23:
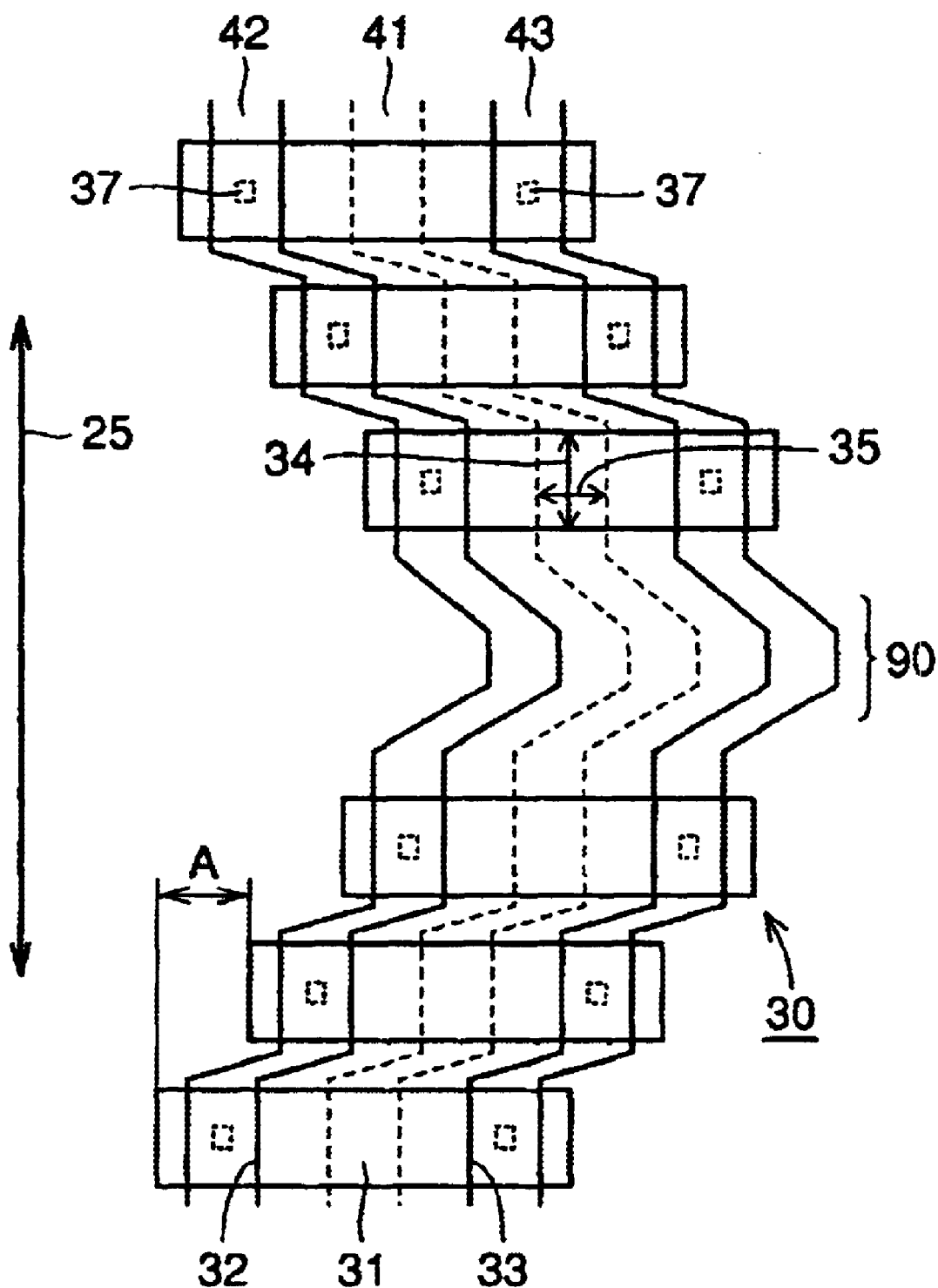
FIG. 23 is a plan view representing an arrangement of the driving transistors in accordance with a second embodiment.

In the second embodiment of the present invention, the direction of the width 34 of the channel region of each transistor is parallel to the direction 25 of the longer axis of the laser beam, as shown in FIG. 23. Referring to FIG. 23, the shift pitch A of three driving transistors arranged on a portion corresponding to one quarter of the wavelength, i.e., one quarter of the period of the repeating pattern, of the zigzag line should preferably be larger than the scan pitch P of the laser beam, although it may be smaller. In the second embodiment, the first and second straight lines respectively consist of a plurality of parallel straight line segments, parallel to the respective channel widths 34 of the respective transistors, and oblique line segments oblique to and connecting pairs of the straight line segments.

Because of this arrangement, even when the defective portion resulting from the miss shot happens to cover the channel region 31 of any of the driving transistors, not all the channel portions of all the driving transistors are covered by the defective portion. The defective portion may possibly overlap the source region 33 or the drain region 32 of an adjacent driving transistor. Even when the defective portion overlaps the source region or the drain region, the influence on the display quality is negligible. Possibility of degradation of image quality decreases when the shift pitch A of the driving transistors is larger than the scan pitch P of the laser beam. Even when the shift pitch A of the driving transistors is smaller than the scan pitch P of the laser beam, there is still the effect of dispersing risk, and hence degradation of display quality can be limited even in such a case.

As a result, it becomes possible to form the X-direction driving circuit portion while eliminating the possibility of substantial degradation of the display quality. Thus, decrease in production yield can be avoided. Further, as the driving transistors are arranged along zigzag lines, the transistors do not extend beyond the driving circuit portion. Therefore, the frame widths 18 and 19 of FIGS. 21 and 22 showing the first embodiment are not enlarged, and hence narrow frame can be realized.

Third Embodiment

Figure 24:
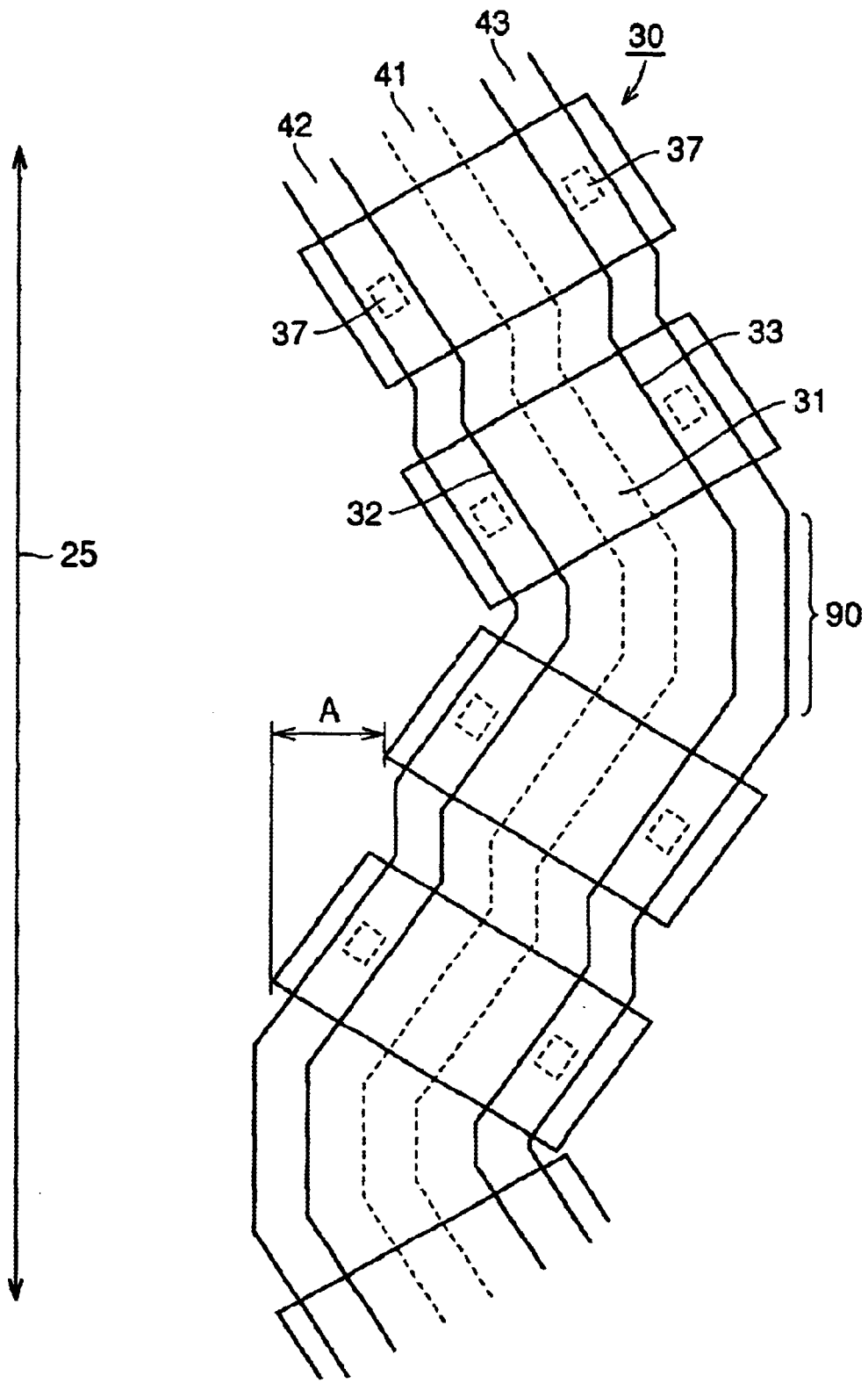
FIG. 24 is a plan view representing an arrangement of the driving transistors in accordance with a third embodiment.

In the third embodiment of the present invention, two driving transistors are arranged on a portion corresponding to a quarter of the wavelength of the zigzag folded line. The projection distance A to the laser beam scanning direction of the shift between the two driving transistors should preferably be larger than the pitch P of laser beam scanning, though it may be smaller. By the arrangement of the driving transistors shown in FIG. 24, even when the area corresponding to one pitch of the miss shot overlaps the channel region 31, not all the driving transistors are made defective. Therefore, substantial degradation of the display quality can be prevented. Further, the arrangement of the driving transistors do not enlarge the frame, and therefore, the arrangement is effective to realize a narrow frame.

Fourth Embodiment

Figure 25:
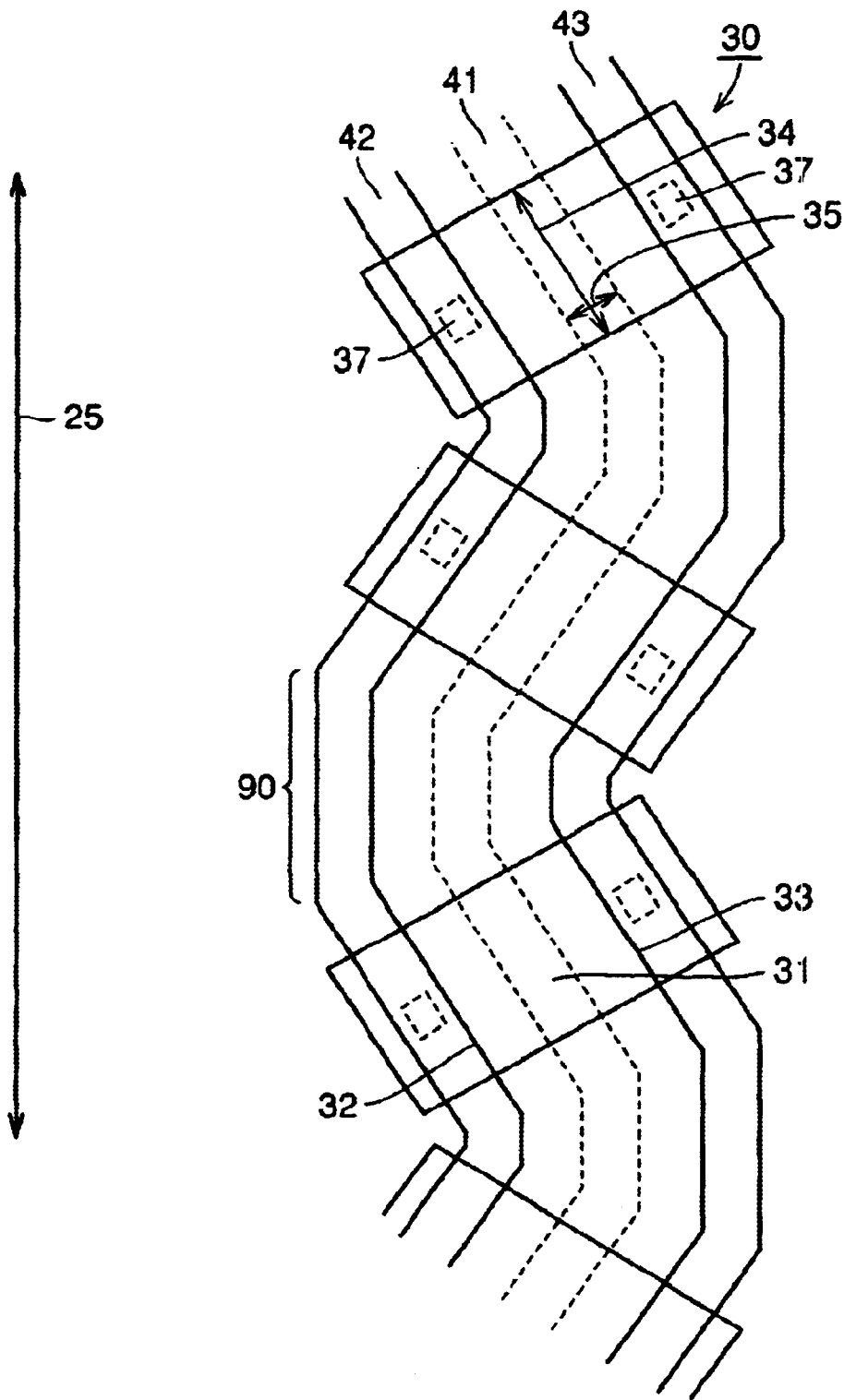
FIG. 25 is a plan view representing an arrangement of the driving transistors in accordance with a fourth embodiment.
Figure 26:
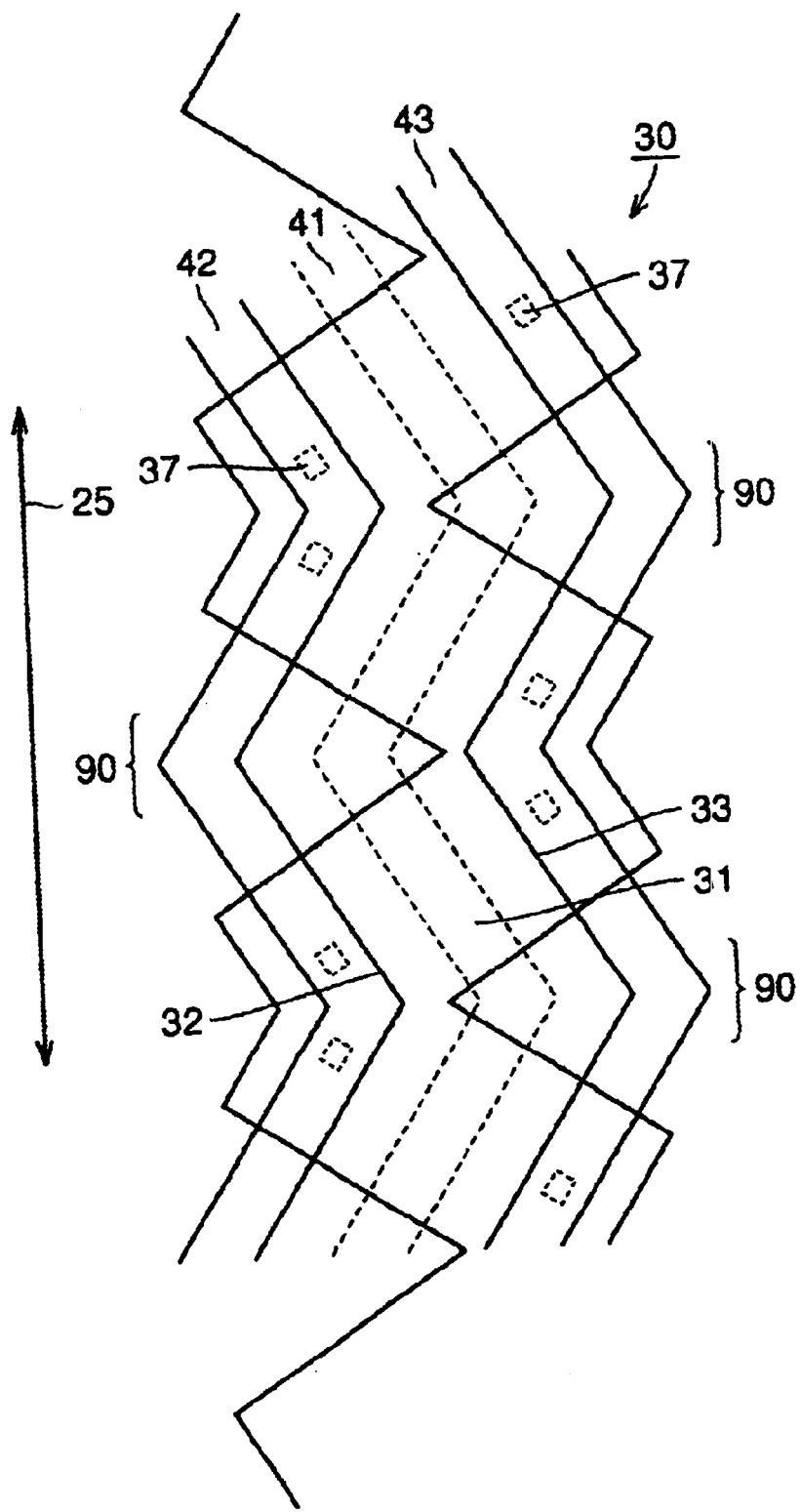
FIG. 26 is a plan view representing an arrangement of the driving transistors in accordance with a fifth embodiment.

In the fourth embodiment, one driving transistor is arranged on a portion corresponding to a quarter of the wavelength of the zigzag folded line. In this arrangement also, neighboring driving transistors may be shifted along the scanning direction of the laser beam. Here, it is desired that the neighboring driving transistors are shifted to some extent from each other, and further, the direction of the channel width 34 of each driving transistor is inclined from the direction 25 of the longer axis of the laser beam cross section, as shown in FIG. 26. Even when large inclination does not possible, the effect of shifting mentioned above is exhibited, and therefore, even when the channel region of one driving transistor is fully traversed by the defective area, the remaining three driving transistors positioned in the portion corresponding to one wavelength can be left intact. In the example shown in FIG. 25, the lines have constant inclination and constant length. When the inclination and the length of the zigzag line varies for every portion corresponding to a quarter of the wavelength, the shift described above can be ensured more easily.

In addition to the effect of shifting, the effect of inclination (rotation) further contributes to prevention of one pitch of miss shot traversing the channel region, even when one pitch of the laser beam miss shot happens to overlap the channel region of the driving transistor. In other words, there would be a portion where the channel region can be passed through, not hindered by the miss shot portion. Further, the arrangement of the driving transistors do not enlarge the frame, and therefore it is effective to realize a narrow frame.

Fifth Embodiment

The fifth embodiment of the present invention is similar to the fourth embodiment, and the driving transistors are arranged in the manner as shown in FIG. 26. By the arrangement of FIG. 26, in addition to the effect obtained by the arrangement of FIG. 25, it becomes possible to compress the arrangement of the driving transistors along the direction of the longer axis (Y direction) of the laser beam cross section. As a result, it becomes possible to make narrower the frame width in this direction (Y direction).

In the arrangement of the driving transistor shown in FIG. 26, it is possible to shift the neighboring driving transistors from each other along the scanning direction of the laser beam. By the shifting along the scanning direction of the laser beam, it is possible to enhance dispersion of the risk. Further, it is possible to attain the effect of preventing substantial degradation of the display quality, in addition to the effect of attaining narrower frame.

Figure 27:
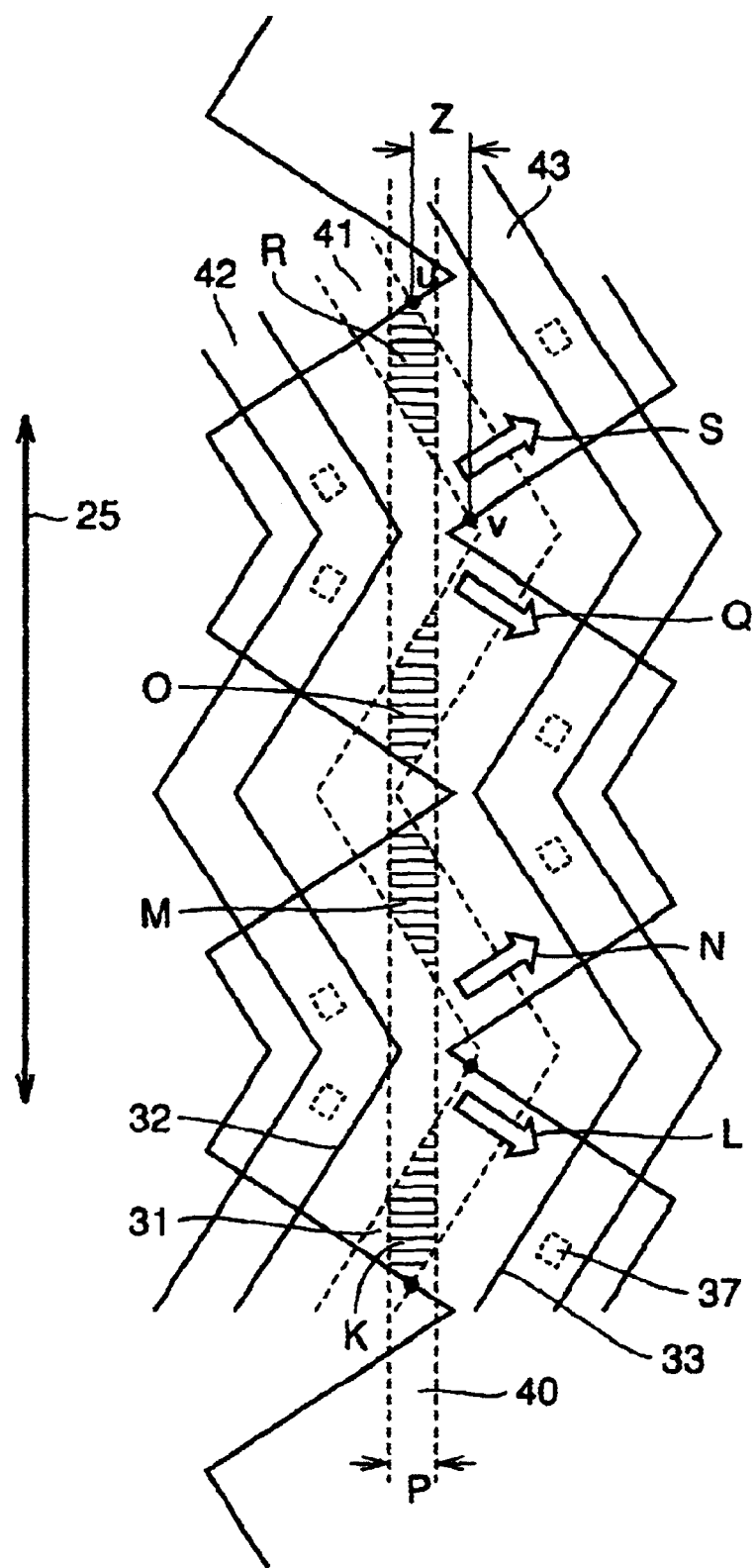
FIG. 27 is a plan view representing an arrangement of the effective area with respect to each driving transistor, when the defective area resulting from a laser beam miss shot overlaps the channel regions of the driving transistors shown in FIG. 26.
Figure 28:
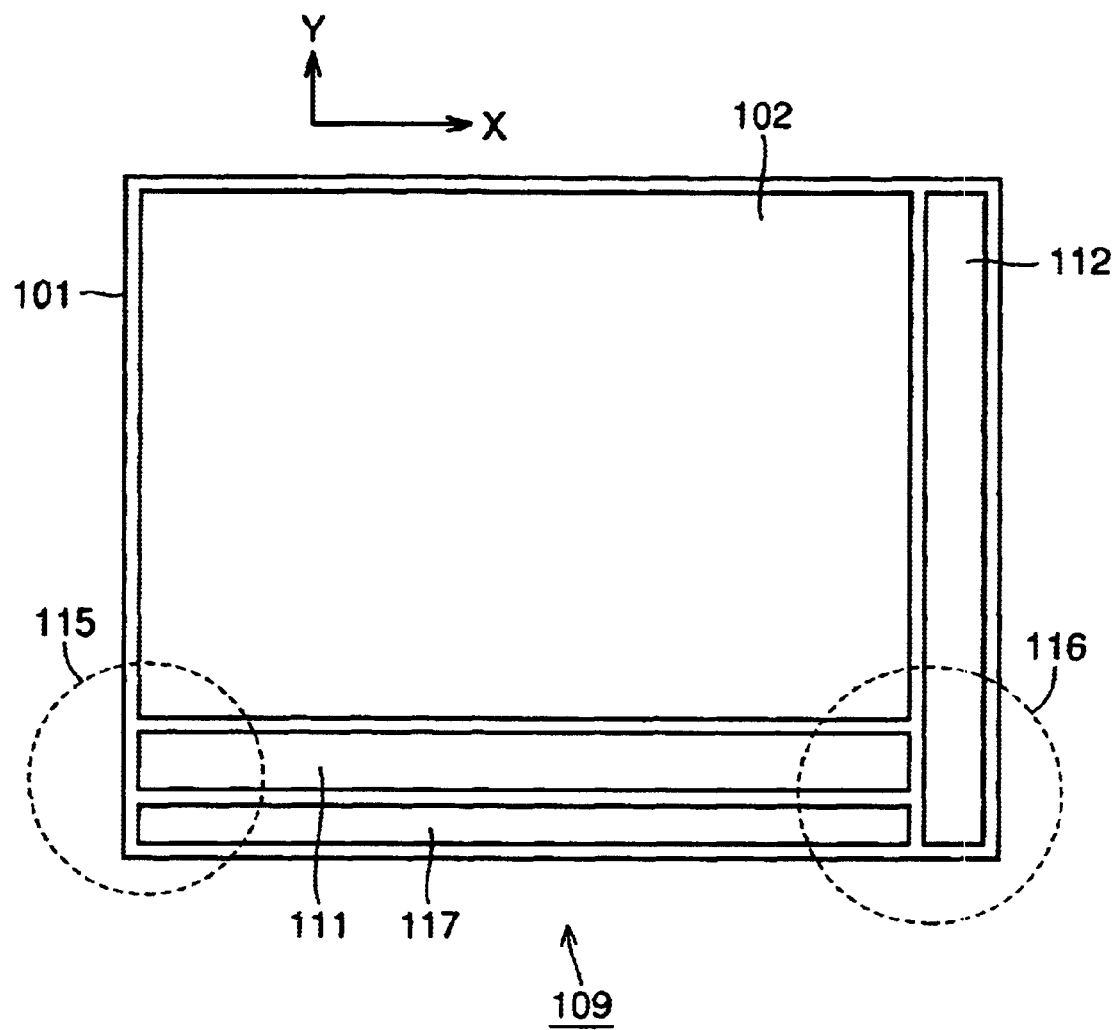
FIG. 28 is a plan view schematically showing a structure of a TFT panel.
Figure 29:
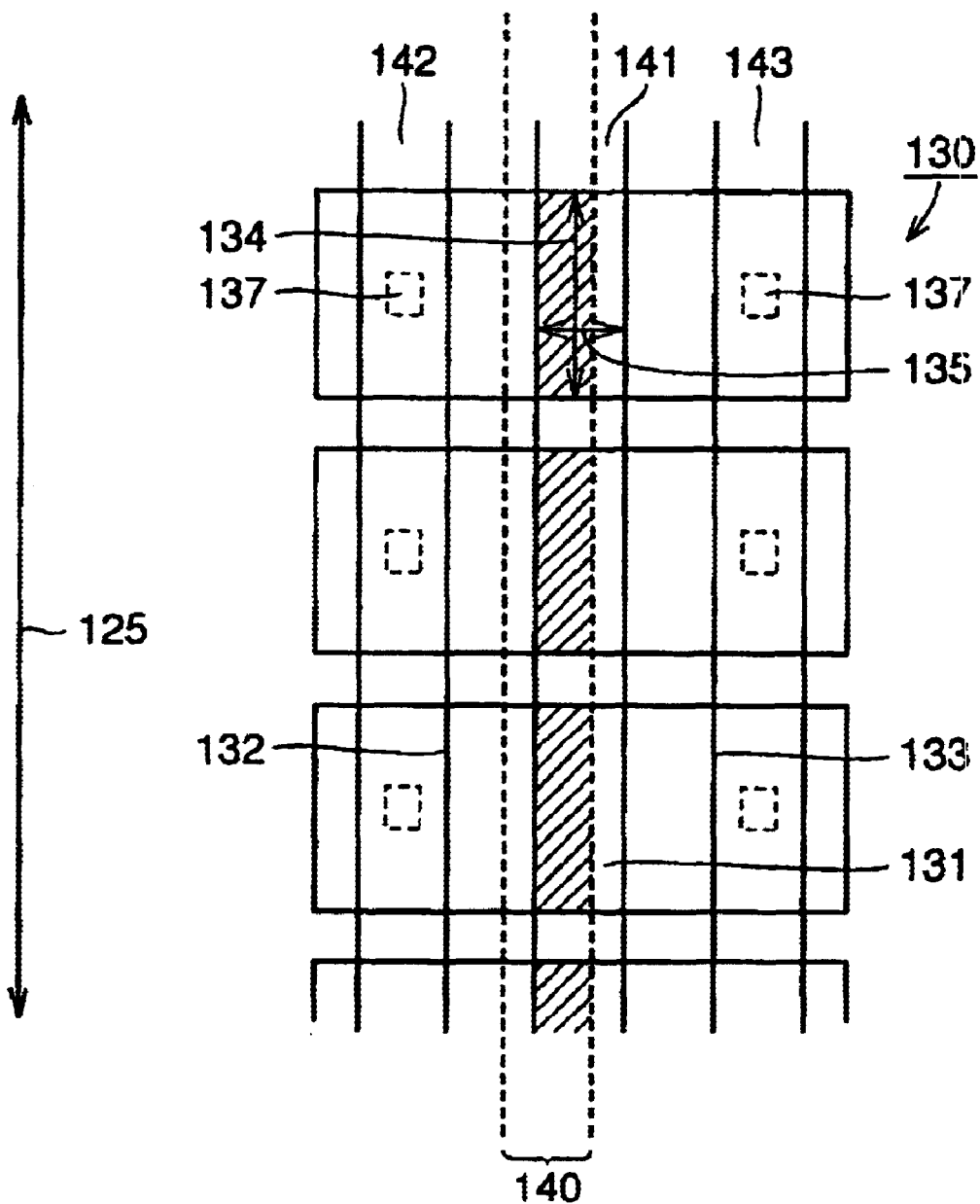
FIG. 29 is a plan view representing a conventional arrangement where the defective area resulting from the miss shot overlaps the channel regions of the driving transistors.
Figure 30:
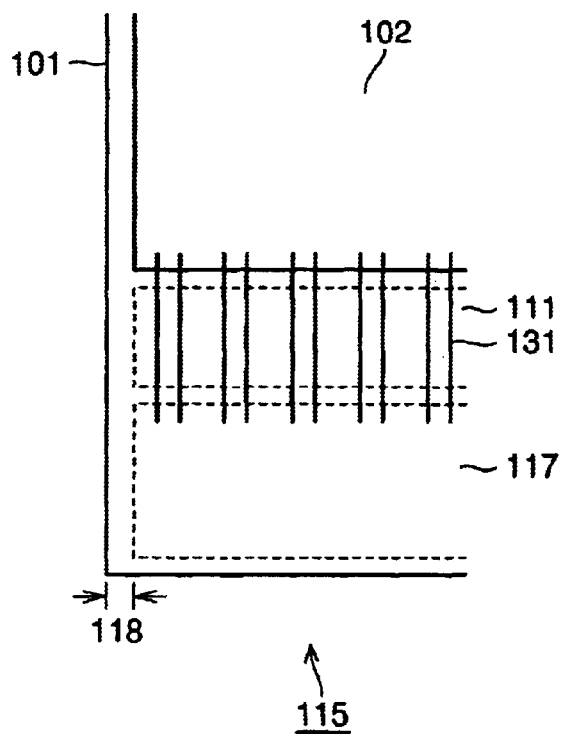
FIG. 30 is a plan view representing an arrangement of the driving transistors at a corner of the driving circuit portion in the prior art example of FIG. 29.
Figure 31:
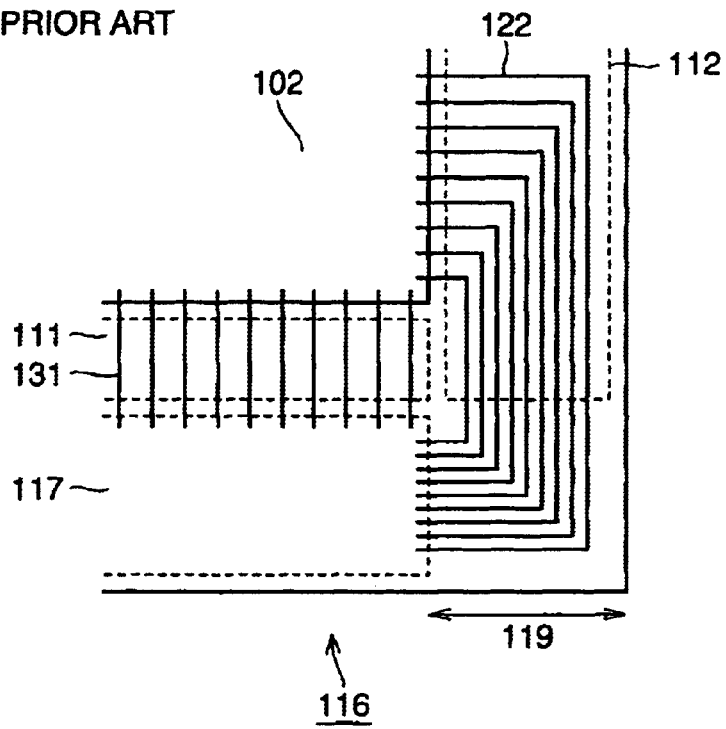
FIG. 31 is a plan view representing an arrangement of the driving transistors at another corner of the driving circuit portion in accordance with the prior art example of FIG. 29.
Figure 32:
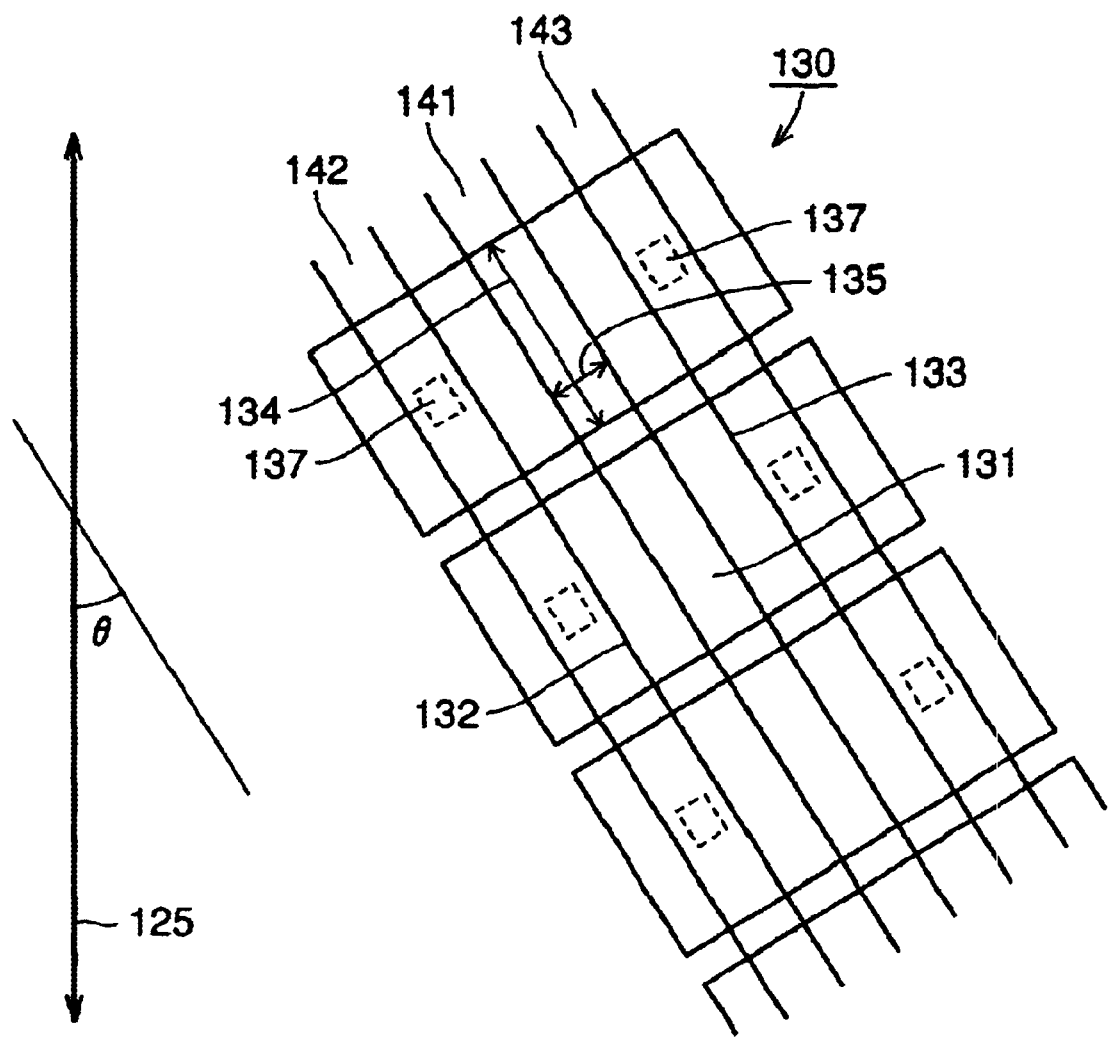
FIG. 32 is a plan view representing an arrangement of the driving transistors in another prior art example.
Figure 33:
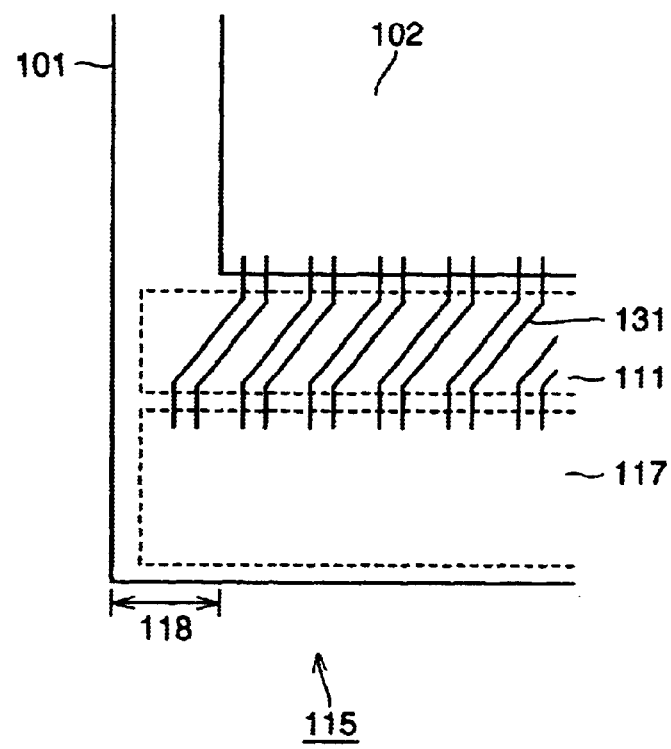
FIG. 33 is a plan view representing an arrangement of the driving transistors at a corner of the driving circuit portion in the prior art example of FIG. 32.
Figure 34:
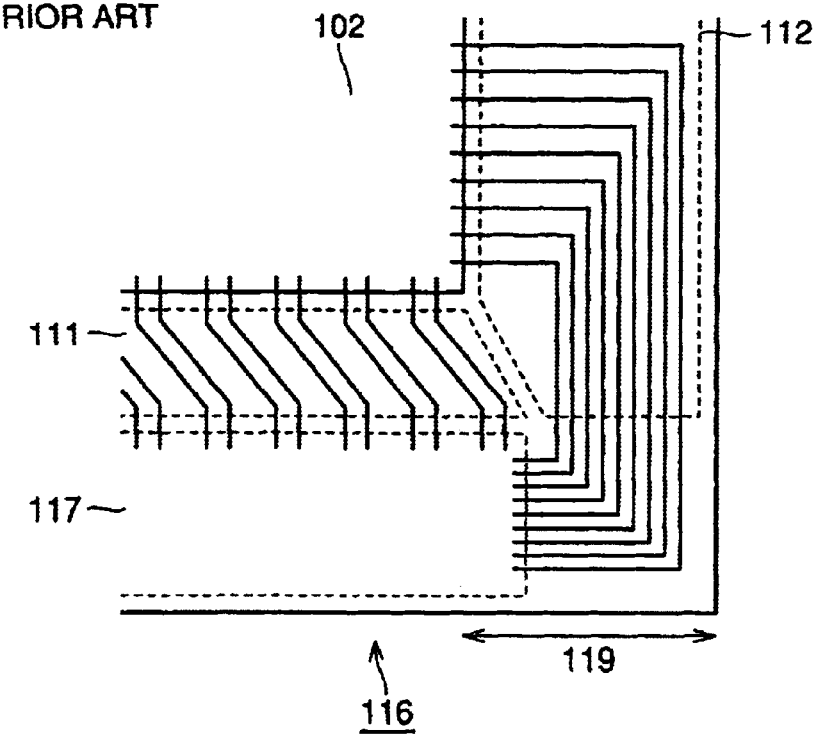
FIG. 34 is a plan view representing an arrangement of the driving transistors at another corner of the driving circuit portion in the prior art example of FIG. 32.

FIG. 27 shows an example in which the defective area overlaps and is completely included in the channel regions of the driving transistors. In the channel regions of all the driving transistors, the width of the defective area is fully within the channel region, and there are formed overlapping areas K, M, O and R. In the driving transistor having the overlapping area R, projection distance Z to the direction of laser beam scanning between a corner u nearest to the display area and a corner v farthest from the display area of the channel region is larger than the scan pitch P of the laser beam. Therefore, there are passages through the channel regions not intercepted by the defective area, as shown by the arrows L, N, Q and S, and hence the driving transistors are not so degraded as to have the undesirable influence on the display quality. In FIG. 27, the width of the defective area 40 is fully included in the channel region. Therefore, the condition is the same even when the effective area is shifted to some extent, with the width of the defective area being within the channel region. More specifically, when the defective area 40 is slightly shifted to the right from the position shown in FIG. 27 to be at the central portion of the channel region, the total area of those portions at which the channel region can be passed through without intercepted by the effective area is unchanged. Such portions allowing passage through the channel regions are divided into two with the defective portion 40 in between, and the total area of these portions divided into two is the same as that in the arrangement shown in FIG. 27. Therefore, no matter how the defective area is positioned, substantial degradation of the display quality can be avoided. More specifically, as long as a large angle of rotation in the inclined arrangement is ensured, all the driving transistors can be arranged to avoid any problem.

In FIG. 27, the driving transistors are 0-shifted in the scanning direction of the laser beam. The driving transistors, however, can be shifted from each other along the scanning direction, within the range corresponding to a quarter of the wavelength of the zigzag folded line. Because of this shift, even when the large angle of inclined arrangement cannot be ensured, the risk can be dispersed. More specifically, even when the angle of rotation of the inclined arrangement cannot be made as large as described above, among the four transistors corresponding to one wavelength, though the channel region of one driving transistor is fully traversed by the defective area, the remaining three driving transistors are positioned free from the problem. Such an arrangement can be readily realized if the zigzag folded line is made irregular for every quarter wavelength.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A liquid crystal display apparatus including:
   a liquid crystal display; and
   a thin film transistor (TFT) panel, for driving the liquid crystal display, having a display area and, on at least one side of said display area, a driving circuit area on which a plurality of driving transistors are located, said driving transistors including respective sources, gates, drains, and channel regions electrically connecting respective sources and drains, and said driving circuit area including gate interconnections interconnecting gates of at least pairs of said driving transistors, wherein said gate interconnections are located along respective zigzag patterns, each zigzag pattern including a first straight line extending along a first direction, a second straight line extending along a second direction different from the first direction, and a third straight line intersecting and oblique to each of the first and second straight lines, and said gates of said driving transistors that are interconnected are located on the first and second straight lines, and said channel regions of said driving transistors do not overlie the third straight line.

2. The liquid crystal display apparatus according to claim 1, wherein each of the first and second straight lines includes a plurality of parallel straight line segments joined by respective oblique straight line segments oblique to the parallel straight line segments.

3. The liquid crystal display apparatus according to claim 1, wherein said channel regions of said driving transistors that are interconnected have respective widths that are parallel to the first and second straight lines.

4. The liquid crystal display apparatus according to claim 1, wherein said driver transistors are polycrystalline silicon, crystallized from amorphous silicon by irradiation with a laser beam tracing stripes on said TFT panel, the stripes being spaced at uniform interval on the TFT panel, and distance between a first of said driving transistors and a second of said driving transistors, neighboring and positioned nearest to the first driving transistor, is longer than the interval of the stripes that are traces of the laser beam.

5. The liquid crystal display apparatus according to claim 1, wherein said driver transistors are polycrystalline silicon, crystallized from amorphous silicon by irradiation with a laser beam tracing stripes on said TFT panel, the stripes being spaced at uniform interval on the TFT panel, and, in the channel region of each of said driving transistors, distance between a corner of the channel region nearest to said display area and a corner of the channel region farthest from said display area, is longer than the interval of the stripes that are traces of the laser beam.

6. A thin film transistor panel for driving a liquid crystal display including a plurality of driving transistors located on a driving circuit area, said driving transistors including respective sources, gates, drains, and channel regions electrically connecting respective sources and drains, and said driving circuit including gate interconnections interconnecting gates of at least pairs of said driving transistors, wherein said gate interconnections are located along respective zigzag patterns, each zigzag pattern including a first straight line extending along a first direction, a second straight line extending along a second direction different from the first direction, and a third straight line intersecting and oblique to each of the first and second straight lines, and said gates of said driving transistors that are interconnected are located on the first and second straight lines, and said channel regions of said driving transistors do not overlie the third straight line.

7. The liquid crystal display apparatus according to claim 6, wherein each of the first and second straight lines includes a plurality of parallel straight line segments joined by respective oblique straight line segments oblique to the parallel straight line segments.

8. The liquid crystal display apparatus according to claim 6, wherein said channel regions of said driving transistors that are interconnected have respective widths that are parallel to the first and second straight lines.

* * * * *